US 12,095,382 B2
(45) Date of Patent: Sep. 17, 2024

(12) United States Patent
Ide et al.

(10) Patent No.: US 12,095,382 B2

(54) SEMICONDUCTOR DEVICE, ELECTRIC POWER CONVERSION DEVICE, AND MANUFACTURING METHOD OF SEMICONDUCTOR DEVICE

(71) Applicant: HITACHI, LTD., Tokyo (JP)

(72) Inventors: Eiichi Ide, Tokyo (JP); Junpei Kusukawa, Tokyo (JP); Nobutake Tsuyuno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 460 days.

(21) Appl. No.: 17/442,279

(22) PCT Filed: Apr. 1, 2020

(86) PCT No.: PCT/JP2020/015104
§ 371 (c)(1),
(2) Date: Sep. 23, 2021

(87) PCT Pub. No.: WO2020/209166
PCT Pub. Date: Oct. 15, 2020

(65) Prior Publication Data
US 2022/0166337 A1 May 26, 2022

(30) Foreign Application Priority Data
Apr. 12, 2019 (JP) .................. 2019-076467

(51) Int. Cl.
H02M 7/00 (2006.01)
H02M 7/02 (2006.01)
H02M 7/537 (2006.01)

(52) U.S. Cl.
CPC .......... H02M 7/003 (2013.01); H02M 7/537 (2013.01)

(58) Field of Classification Search
CPC ..................................... H02M 7/003
See application file for complete search history.

(56) References Cited

U.S. PATENT DOCUMENTS

2009/0201708 A1* 8/2009 Ohkouchi ............... H01L 25/18
363/132
2013/0107548 A1* 5/2013 Kim ..................... H01L 33/62
257/E33.057

(Continued)

FOREIGN PATENT DOCUMENTS

EP     3 067 925 A1    9/2016
JP     2012-138409 A   7/2012

(Continued)

OTHER PUBLICATIONS

Supplementary Partial European Search Report issued in corresponding European Patent Application No. 20786979.3, dated Jan. 10, 2023 (15 pages).

(Continued)

Primary Examiner — Hoa C Nguyen
(74) Attorney, Agent, or Firm — Foley & Lardner LLP

(57) ABSTRACT

A semiconductor device includes: a semiconductor element that converts DC electric power into AC electric power; a DC terminal that transmits DC electric power; an AC terminal that transmits AC electric power; a sealing member that seals the semiconductor element, at least a part of the DC terminal, and at least a part of the AC terminal; and at least one floating terminal that is arranged between the DC terminal and the AC terminal.

9 Claims, 21 Drawing Sheets

(56) References Cited

U.S. PATENT DOCUMENTS

| | | | |
|---|---|---|---|
| 2013/0279230 A1 | 10/2013 | Suwa et al. | |
| 2014/0001613 A1 | 1/2014 | Ha | |
| 2014/0159054 A1* | 6/2014 | Otake | H01L 23/053 257/77 |
| 2016/0079221 A1* | 3/2016 | Inokuchi | H01L 23/051 438/123 |
| 2016/0247793 A1 | 8/2016 | Ohno | |
| 2020/0266135 A1 | 8/2020 | Yano et al. | |
| 2021/0167003 A1* | 6/2021 | Ieiri | H01L 23/49861 |

FOREIGN PATENT DOCUMENTS

| | | |
|---|---|---|
| JP | 2016-157850 A | 9/2016 |
| JP | 2016-197985 A | 11/2016 |
| JP | 2018-067644 A | 4/2018 |
| WO | WO-2018/074297 A1 | 4/2018 |
| WO | WO-2018/207406 A1 | 11/2018 |

OTHER PUBLICATIONS

Extended European search report issued in corresponding European Patent Application No. 20786979.3, dated Jun. 9, 2023 (14 pages).
International Search Report with English translation and Written Opinion issued in corresponding application No. PCT/JP2020/015104 dated Jun. 30, 2020.

* cited by examiner

FIG. 8

SEMICONDUCTOR DEVICE, ELECTRIC POWER CONVERSION DEVICE, AND MANUFACTURING METHOD OF SEMICONDUCTOR DEVICE

TECHNICAL FIELD

The present invention relates to a semiconductor device, an electric power conversion device, and a manufacturing method of a semiconductor device.

BACKGROUND ART

High-efficiency electric power conversion devices using switching of semiconductor elements called power semiconductor chips have been used in a wide range of fields such as automobiles, railways, industrial equipment, and electric power equipment. In recent years, in order to reduce $CO_2$, it has been considered to mount such an electric power conversion device capable of realizing energy saving in an airplane.

A high voltage is applied to a semiconductor element in a power semiconductor module, and thus, if a defect such as a gap or a crack exists in an insulating member such as a case for accommodating the semiconductor element, there is a possibility that an electric field is concentrated in the defective part and corona discharge occurs. If the corona discharge continues to occur, there is a risk that the insulating member deteriorates and eventually breaks down, causing the power semiconductor module to fail. The corona discharge is likely to occur in higher altitude environments with lower atmospheric pressure.

There has conventionally been known a power semiconductor module having a structure in which a semiconductor element is accommodated in a casing where a metal base plate and an insulating case are fixed to each other by screws and lead terminals connected to the semiconductor element are arrayed on one surface side of the outside of the insulating case. In this structure, it has been pointed out that an electric field is concentrated in a gap between the bottom of a screw and the bottom of a screw hole to which the screw is screwed, and corona discharge easily occurs. For this reason, there is a structure in which a step part is provided at an upper part of the screw hole to which the screw is screwed in the insulating case, a conductor is provided on an upper surface of the step part, and the conductor and a metal case plate metal base plate are electrically connected to each other by a wire. In this structure, it has been described that the potential of the conductor becomes the same as the metal base plate, and no voltage is applied to the gap between the bottom of the screw and the bottom surface of the screw hole, so that the occurrence of the corona discharge can be prevented (see, for example, Patent Document 1).

PRIOR ART DOCUMENT

Patent Document

Patent Document 1: JP-2018-67644-A

SUMMARY OF THE INVENTION

Problem to be Solved by the Invention

In the power semiconductor module described in Patent Document 1, there is a risk that a high potential is applied between the lead terminals arrayed on one surface side of the outside of the insulating case and the corona discharge occurs.

Means for Solving the Problem

A semiconductor device according to a first aspect of the present invention includes: a semiconductor element that converts direct-current (DC) electric power into alternating-current (AC) electric power; a DC terminal that transmits DC electric power; an AC terminal that transmits AC electric power; a sealing member that seals the semiconductor element, at least a part of the DC terminal, and at least a part of the AC terminal; and at least one floating terminal that is arranged between the DC terminal and the AC terminal.

An electric power conversion device according to a second aspect of the present invention includes: the semiconductor device; and a control terminal portion that is connected to a control terminal of the semiconductor element. The control terminal portion is provided adjacent to the DC terminal or the AC terminal, and at least another floating terminal is provided between the control terminal portion and the DC terminal or the AC terminal.

A manufacturing method of a semiconductor device according to a third aspect of the present invention includes: connecting each of a DC terminal and an AC terminal to a semiconductor element that converts DC electric power into AC electric power; sealing the semiconductor element and at least a part of each of the DC terminal and the AC terminal with a sealing member; and providing at least one floating terminal between the DC terminal and the AC terminal.

Advantage of the Invention

According to the present invention, it is possible to suppress corona discharge occurring at a defective part of a sealing member.

BRIEF DESCRIPTION OF THE DRAWINGS

FIG. 8 is a characteristic diagram for showing a relation between the minimum corona discharge start voltage and the thickness of the insulating layer, and shows each characteristic in the case where the dielectric constant is different.

MODES FOR CARRYING OUT THE INVENTION

A semiconductor device that is an electric power conversion device according to each embodiment of the present invention is particularly optimum for an airplane flying in a space at a high altitude, but is also applicable to an electric power conversion device of an automobile, a truck, a train, a ship, or the like other than the airplane. In addition, it is also applicable to industrial electric power conversion devices used for control devices of motors for driving factory facilities, or household electric power conversion devices used for control of motors for driving household solar power generation systems and household electric appliances.

First Embodiment

Hereinafter, a first embodiment of a semiconductor device of the present invention will be described with reference to FIG. 1 to FIG. 14.

Figure 1:
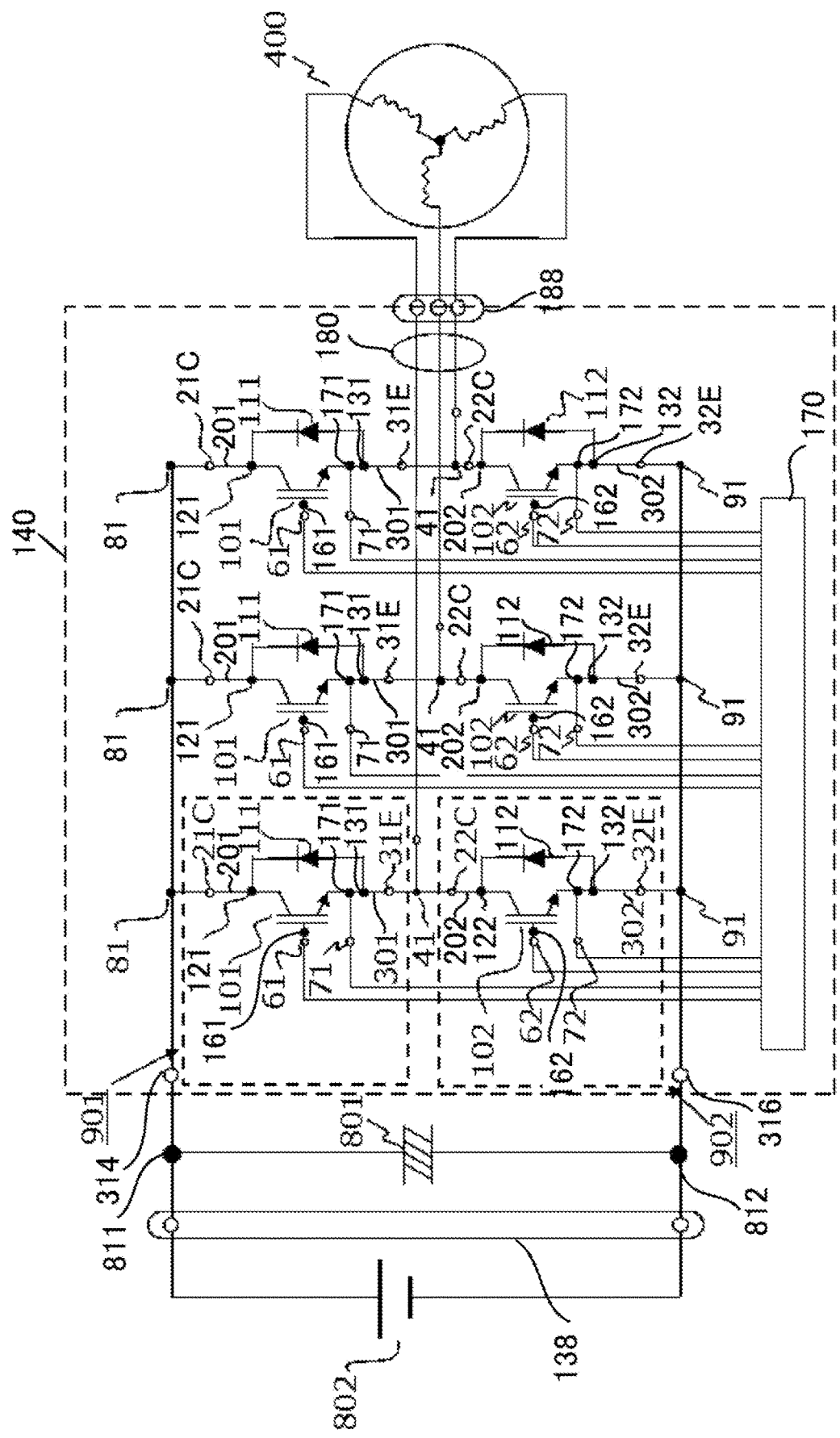
FIG. 1 is a circuit diagram of a semiconductor device having an electric power conversion circuit of the present invention.

FIG. 1 is a circuit diagram of a semiconductor device having an electric power conversion circuit of the present invention.

The semiconductor device having a function as an electric power conversion device includes an inverter circuit 140, a smoothing capacitor module 801, and a control unit 170. A battery 802 is electrically connected to the inverter circuit 140. The capacitor module 801 provided between the battery 802 and the inverter circuit 140 smooths a DC current. The smoothing capacitor module 801 has a positive-side capacitor terminal 811 and a negative-side capacitor terminal 812. The smoothing capacitor module 801 is electrically connected to the battery 802 via a DC connector 138. The inverter circuit 140 is connected to the positive-side capacitor terminal 811 via a DC positive-side terminal 314, and is connected to the negative-side capacitor terminal 812 via a DC negative-side terminal 316.

The inverter circuit 140 has an upper arm circuit 901, a lower arm circuit 902, and the control unit 170. In the inverter circuit 140, upper and lower arm series circuits of three phases (U-phase, V-phase, W-phase) including IGBTs 101 (semiconductor elements) and diodes 111 configuring the upper arm circuit 901 and IGBTs 102 (semiconductor elements) and diodes 112 configuring the lower arm circuit 902 are provided corresponding to windings of respective phases of armature windings of a motor generator 400. Here, the IGBT is an abbreviation of an insulated gate bipolar transistor. Each of the upper and lower arm series circuits has an AC terminal 41 connected to a midpoint portion thereof. Each of the AC terminals 41 is connected to an AC connector 188 via a current sensor 180. In addition, the AC connector 188 is connected to the motor generator 400.

The IGBT (semiconductor element) 101 includes a collector electrode 121, a gate electrode 161 (control electrode), an emitter sense electrode 171, and an emitter electrode 131. In addition, the IGBT 102 includes a collector electrode 122, a gate electrode 162 (control electrode), an emitter sense electrode 172, and an emitter electrode 132. The diode 111 is electrically connected to the IGBT 101 in parallel. In addition, the diode 112 is electrically connected to the IGBT 102 in parallel. A MOSFET (metal oxide semiconductor field effect transistor) may be used as a switching power semiconductor element, but in this case, the diode 111 and the diode 112 are not necessary.

The collector electrode 121 of the IGBT 101 of each upper arm circuit 901 is connected to the positive-side capacitor terminal 811 of the capacitor module 801 via a collector terminal (DC terminal) 21C and a positive-side connecting portion 81. That is, DC electric power supplied from the battery 802 is transmitted to the upper arm circuit 901 via the collector terminal 21C. The emitter electrode 132 of the IGBT 102 of each lower arm circuit 902 is connected to the negative-side capacitor terminal 812 of the capacitor module 801 via an emitter terminal 32E and a negative-side connecting portion 91.

The control unit 170 includes a driver circuit (not illustrated) for driving and controlling the upper and lower series circuits configured using the upper arm circuit 901 and the lower arm circuit 902, and a control circuit for supplying a control signal to the driver circuit. The IGBT 101 and the IGBT 102 operate in response to a drive signal output from the control unit 170, and convert the DC electric power supplied from the battery 802 into three-phase AC electric power. The converted electric power is supplied to the armature windings of the motor generator 400.

The control unit 170 includes a microcomputer for computing switching timings of the IGBTs 101 and 102. A target torque value required for the motor generator 400, a current value supplied from the upper and lower arm series circuits to the armature windings of the motor generator 400, and the magnetic pole position of a rotor of the motor generator 400 are input to the microcomputer as input information. The target torque value is based on a command signal output from a higher control device (not shown). The current value is detected on the basis of a detection signal output from the current sensor 180 via a signal line (not illustrated). The magnetic pole position is detected on the basis of a detection signal output from a rotating magnetic pole sensor (not illustrated) provided in the motor generator 400.

Figure 2:
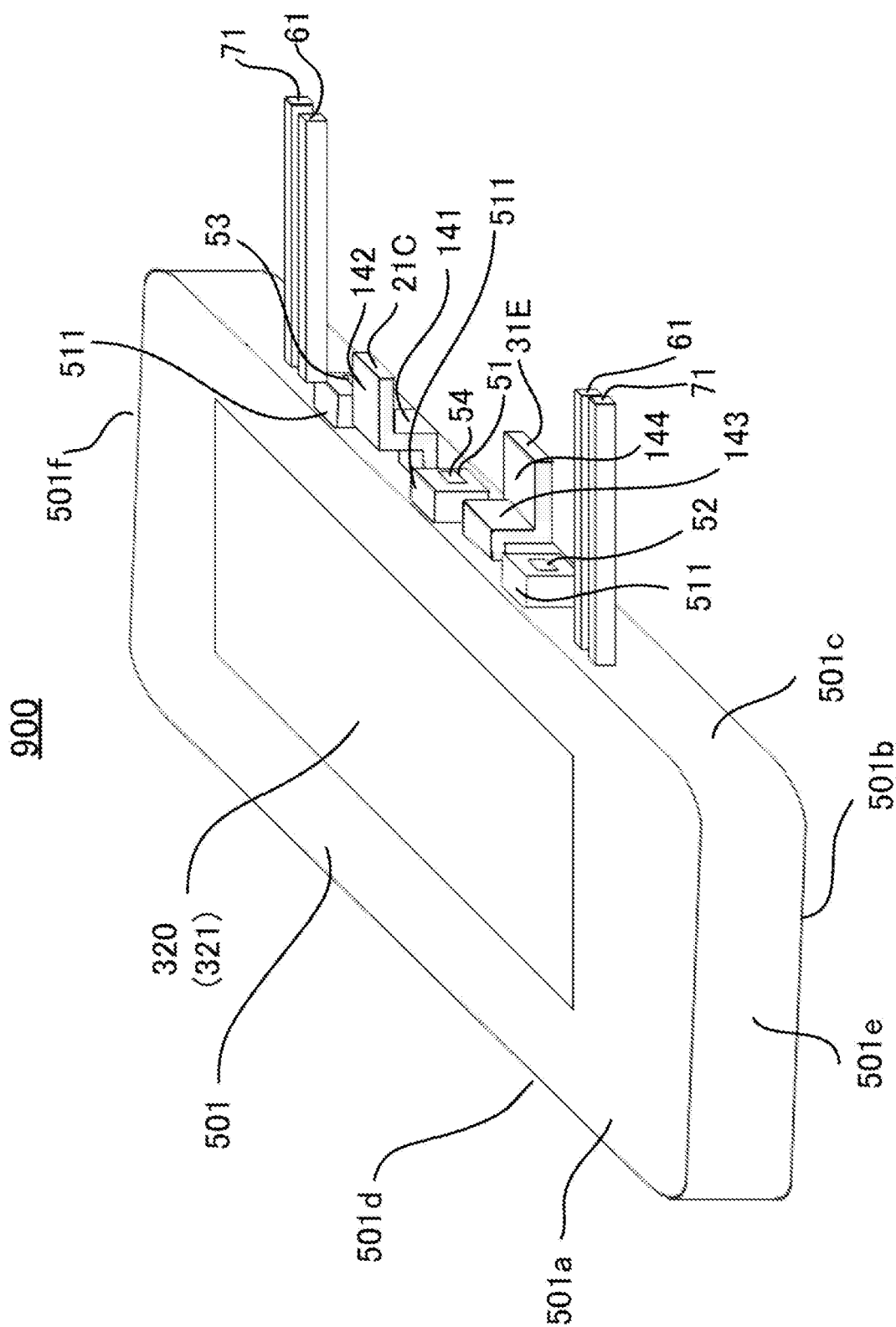
FIG. 2 is an external perspective view of a first embodiment of the semiconductor device having an upper arm circuit according to the present invention.

FIG. 2 is an external perspective view of the first embodiment of the semiconductor device having the upper arm circuit according to the present invention.

A semiconductor device 900 is a 1-in-1 power semiconductor module having the upper arm circuit 901 shown in FIG. 1.

Figure 4:
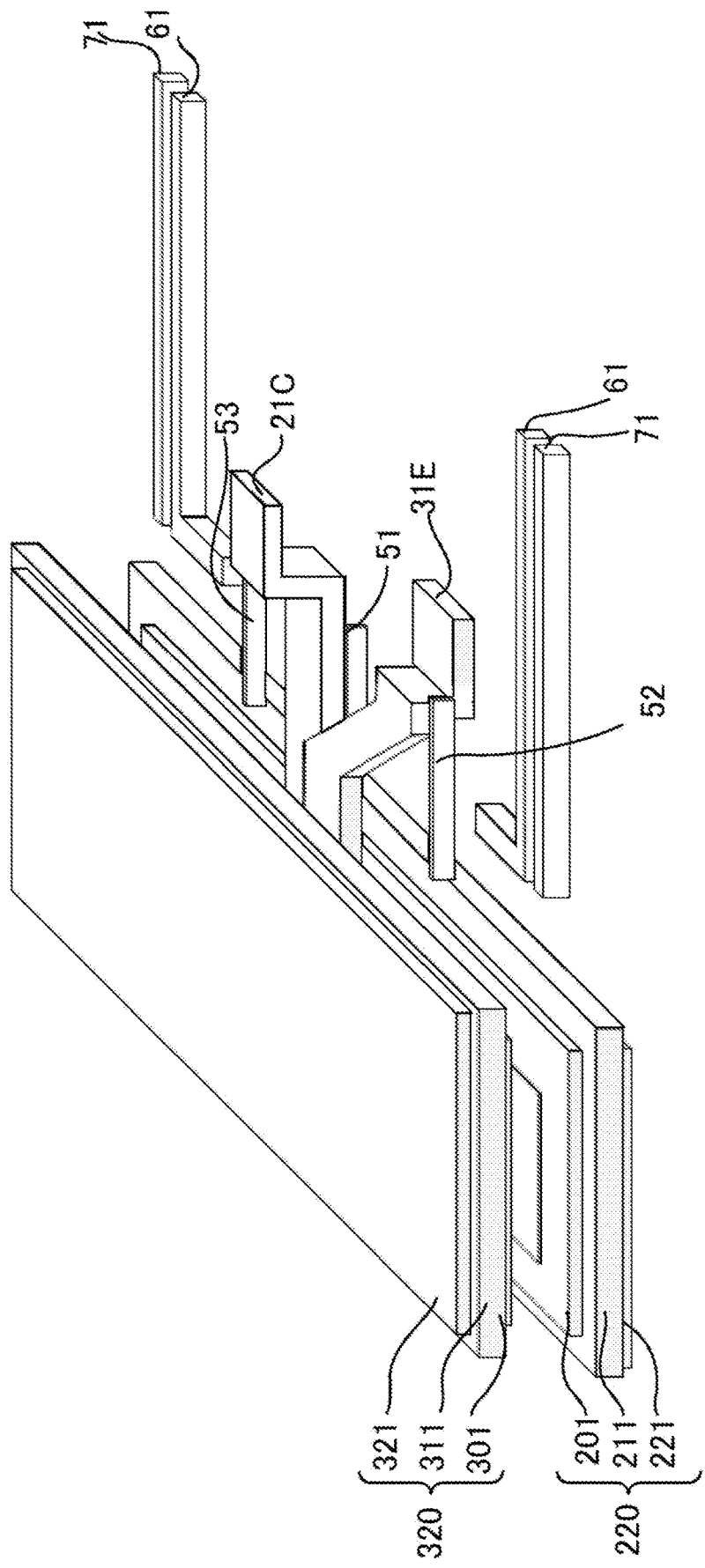
FIG. 4 is an exploded perspective view in a state where a sealing member of the semiconductor device illustrated in FIG. 2 is removed.

The semiconductor device 900 has the IGBTs 101 and the diodes 111 (see FIG. 5) shown in FIG. 1, a sealing member 501 for sealing the IGBTs 101 and the diodes 111, the collector terminal (DC terminal) 21C, an emitter terminal 31E, two gate terminals 61 (control terminals), two emitter sense terminals 71, floating terminals 51, 52, and 53, a collector-side mounting part 220 (see FIG. 4), and an emitter-side mounting part 320 (see FIG. 4).

The sealing member 501 has a substantially thin rectangular parallelepiped shape having a pair of wide surfaces 501a and 501b, a pair of side surfaces 501c and 501d, and a pair of end surfaces 501e and 501f. One surface of the emitter-side mounting part 320 is exposed from one wide surface 501a of the sealing member 501 in a state where a periphery thereof is surrounded by the sealing member 501. Although not illustrated in the drawing, one surface of the collector-side mounting part 220 is exposed from the other wide surface 501b facing the wide surface 501a of the sealing member 501 in a state where a periphery thereof is surrounded by the sealing member 501 as with the wide surface 501a side.

The collector terminal 21C, the emitter terminal 31E, the two gate terminals 61, the two emitter sense terminals 71, and the floating terminals 51, 52, and 53 are partially sealed on the root side with the sealing member 501, and the remaining portions including the tip end portions are exposed from one side surface 501c.

There are no terminal members or the like exposed from the other side surface 501d and the pair of end surfaces 501e and 501f of the sealing member 501.

Figure 3:
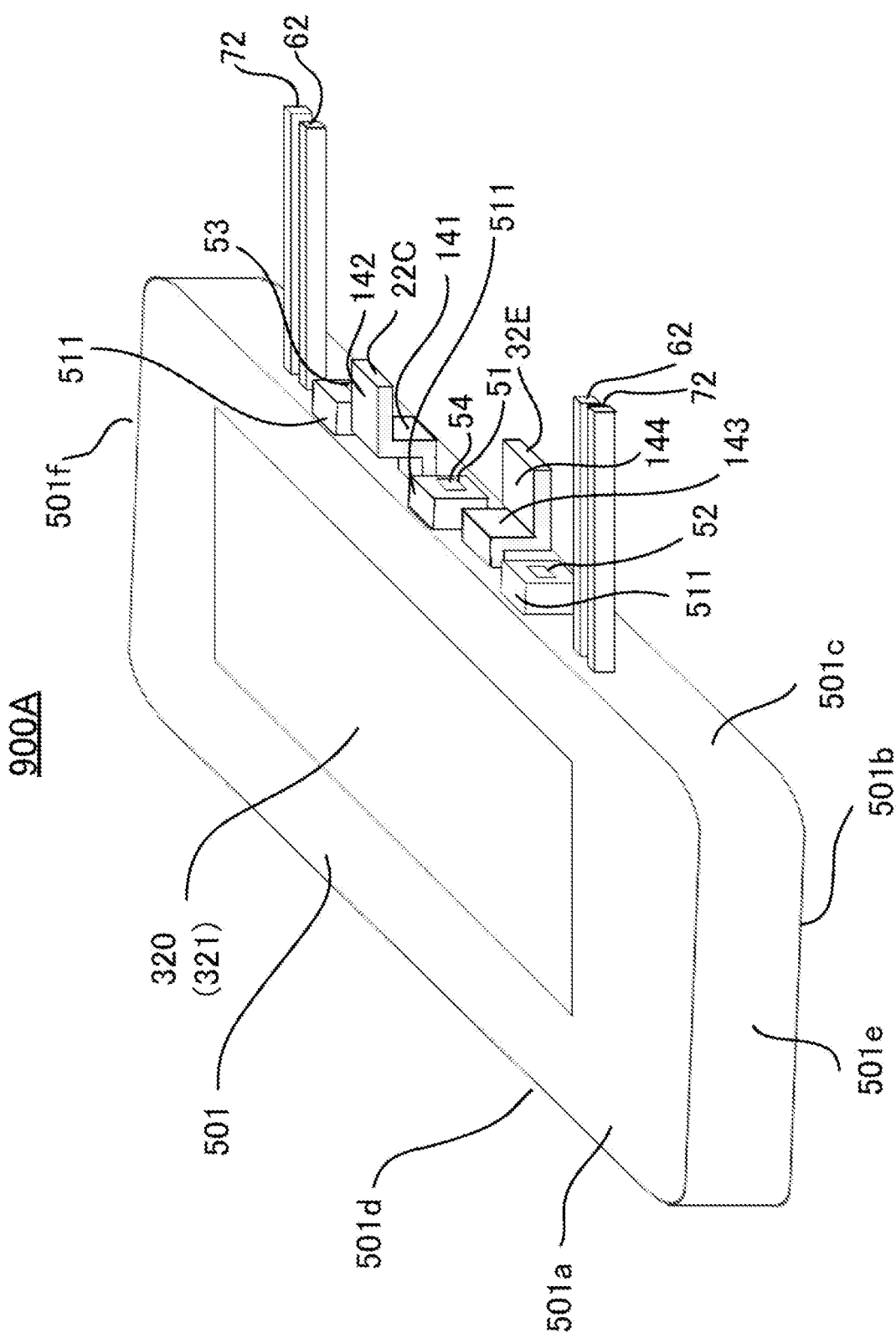
FIG. 3 is an external perspective view of the first embodiment of the semiconductor device having a lower arm circuit according to the present invention.

FIG. 3 is an external perspective view of the first embodiment of the semiconductor device having the lower arm circuit according to the present invention.

A semiconductor device 900A is a 1-in-1 power semiconductor module having the lower arm circuit 902 shown in FIG. 1.

The semiconductor device 900A has the IGBTs 102 and the diodes 112 shown in FIG. 1, a sealing member 501 for sealing the IGBTs 102 and the diodes 112, a collector terminal (AC terminal) 22C, an emitter terminal 32E, two gate terminals 62 (control terminals), two emitter sense terminals 72, floating terminals 51, 52, and 53, a collector-side mounting part 220, and an emitter-side mounting part 320.

The sealing member 501 has a substantially thin rectangular parallelepiped shape having a pair of wide surfaces 501a and 501b, a pair of side surfaces 501c and 501d, and a pair of end surfaces 501e and 501f. One surface of the emitter-side mounting part 320 is exposed from one wide surface 501a of the sealing member 501 in a state where a periphery thereof is surrounded by the sealing member 501. Although not illustrated in the drawing, one surface of the collector-side mounting part 220 is exposed from the other wide surface 501b facing the wide surface 501a of the sealing member 501 in a state where a periphery thereof is surrounded by the sealing member 501 as with the wide surface 501a side.

The collector terminal 22C, the emitter terminal 32E, the two gate terminals 62, the two emitter sense terminals 72, and the floating terminals 51, 52, and 53 are partially sealed on the root side with the sealing member 501, and the remaining portions including the tip end portions are exposed from one side surface 501c.

There are no terminal members or the like exposed from the other side surface 501d and the pair of end surfaces 501e and 501f of the sealing member 501.

When comparing the semiconductor device 900 on the upper arm side and the semiconductor device 900A on the lower arm side, the gate terminals 61, the emitter sense terminals 71, the collector terminal 21C, the emitter terminal 31E, and the floating terminals 51, 52, and 53 of the semiconductor device 900 correspond to the gate terminals 62, the emitter sense terminals 72, the collector terminal 22C, the emitter terminal 32E, and the floating terminals 51, 52, and 53 of the semiconductor device 900A, respectively. Accordingly, if the shapes and positions of the members corresponding to each other are the same, the semiconductor device 900 and the semiconductor device 900A have the same structure.

Although the semiconductor device 900 on the upper arm side will be described in detail below, the following description is also applied to the semiconductor device 900A on the lower arm side by replacing the corresponding members described above with each other.

It should be noted that the collector terminal 21C, the emitter terminal 31E, the gate terminals 61, and the emitter sense terminals 71 of the upper arm circuit 901 and the collector terminal 22C, the emitter terminal 32E, the two gate terminals 62, and the emitter sense terminals 72 of the lower arm circuit 902 are illustrated in the circuit diagram of FIG. 1.

Figure 5:
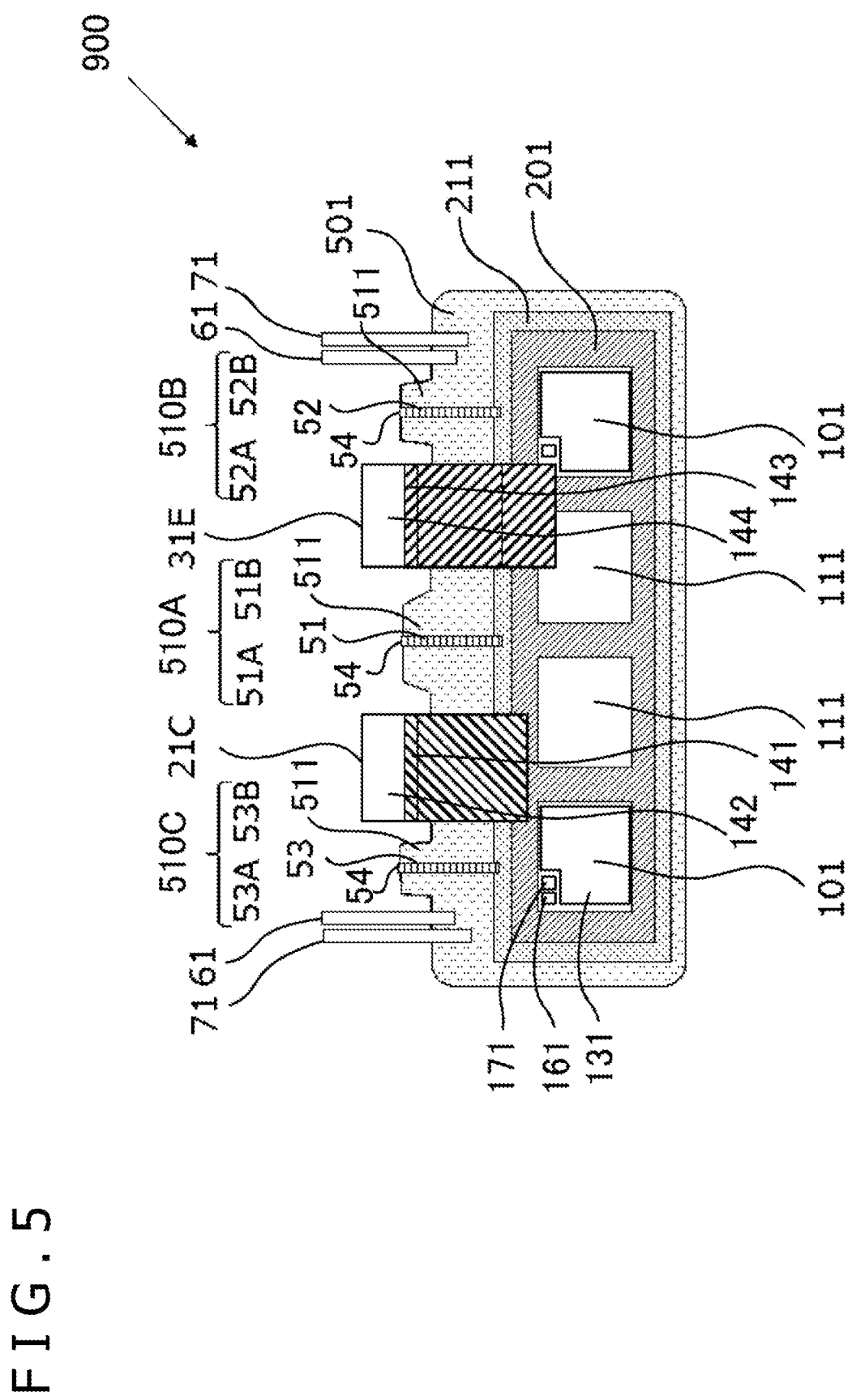
FIG. 5 is a plan view of the semiconductor device illustrated in FIG. 2 by seeing through an emitter-side mounting part from an upper surface side.

FIG. 4 is an exploded perspective view in a state where the sealing member of the semiconductor device illustrated in FIG. 2 is removed, and FIG. 5 is a plan view of the semiconductor device illustrated in FIG. 2 by seeing through the emitter-side mounting part from an upper surface side.

As illustrated in FIG. 4, the semiconductor device 900 has a structure in which the IGBTs 101 and the diodes 111 are sandwiched between the emitter-side mounting part 320 and the collector-side mounting part 220 from an upper side and a lower side.

The collector-side mounting part 220 is configured in such a manner that a collector-side conductor 201, an insulating layer 211, and a metallization layer 221 are laminated in this order from the upper side toward the lower side. Each of the collector-side conductor 201, the insulating layer 211, and the metallization layer 221 has a rectangular shape in plan view, and the insulating layer 211 is formed slightly larger than the collector-side conductor 201 and the metallization layer 221.

The emitter-side mounting part 320 is configured in such a manner that an emitter-side conductor 301, an insulating layer 311, and a metallization layer 321 are laminated in this order from the lower side toward the upper side. Each of the emitter-side conductor 301, the insulating layer 311, and the metallization layer 321 has a rectangular shape in plan view, and the insulating layer 311 is formed slightly larger than the emitter-side conductor 301 and the metallization layer 321.

The collector-side conductor 201 and the emitter-side conductor 301 are formed of copper, aluminum, or an alloy thereof having low electrical resistance. The thickness of each of the collector-side conductor 201 and the emitter-side conductor 301 is approximately 0.1 to 2.5 mm. However, the thickness is not limitative and may be a thickness conforming to a required current capacity or a capacity of a heat spreader.

The insulating layers 211 and 311 are formed of a low thermal expansion insulating material such as ceramics. Layers made of molybdenum, tungsten, or carbon having low thermal expansion and high thermal conductivity, or a composite material of any of these and copper or aluminum may be provided between the collector-side conductor 201 and the insulating layer 211 and between the emitter-side conductor 301 and the insulating layer 311.

The metallization layers 221 and 321 have a heat radiation function and are formed of copper, aluminum, or an alloy thereof having high thermal conductivity. The metallization layers 221 and 321 are exposed from the wide surfaces 501b and 501a of the sealing member 501, respectively. As with the collector-side conductor 201 and emitter-side conductor 301 side, layers made of molybdenum, tungsten, or carbon having a low thermal expansion coefficient and high thermal conductivity, or a composite material of any of these and copper or aluminum may be provided between the metallization layer 221 and the insulating layer 211 and between the metallization layer 321 and the insulating layer 311.

The insulating layers 211 and 311 and the collector-side conductor 201 or the emitter-side conductor 301 are joined to each other by a brazing material or the like. In addition, the insulating layers 211 and 311 and the metallization layers 221 and 321 are joined to each other by a brazing material or the like. It is preferable that the thermal stress determined on the basis of the difference in thermal expansion coefficient between the collector-side conductor 201 side and the metallization layer 221 side and the Young's moduluses thereof be made equal as much as possible across the insulating layer 211. It is preferable that the thermal stress determined on the basis of the difference in thermal expansion coefficient between the emitter-side conductor 301 side and the metallization layer 321 side and the Young's moduluses thereof be made equal as much as possible across the insulating layer 311.

As illustrated in FIG. 5, two IGBTs 101 and two diodes 111 are arranged between the collector-side conductor 201 and the emitter-side conductor 301 (not illustrated in FIG. 5).

Although not illustrated in FIG. 5, the collector electrode 121 is formed on a lower surface of the IGBT 101 facing the collector-side conductor 201. The gate electrode 161 and the emitter electrode 131 are formed on an upper surface of the IGBT 101 facing the emitter-side conductor 301. Each of the collector electrodes 121 of the two IGBTs 101 is metal-joined to the collector-side conductor 201. Each of the emitter electrodes 131 of the two IGBTs 101 is metal-joined to the emitter-side conductor 301.

Although not illustrated in FIG. 5, a cathode electrode is formed on a lower surface of the diode 111 facing the collector-side conductor 201. An anode electrode is formed on an upper surface of the diode 111 facing the emitter-side conductor 301. Each of the cathode electrodes of the two diodes 111 is metal-joined to the collector-side conductor 201. Each of the anode electrodes of the two diodes 111 are metal-joined to the emitter-side conductor 301.

With the above configuration, the two pairs of IGBTs 101 and diodes 111 configure the upper arm circuit 901 shown in FIG. 1.

It should be noted that the collector-side conductor 201 and the emitter-side conductor 301 are illustrated in the circuit diagram of FIG. 1.

The collector terminal 21C is arranged between one IGBT 101 and one diode 111. The collector terminal 21C is metal-joined to the collector-side conductor 201. As the metal joining, joining using a low-temperature sintered joining material mainly containing a solder material and metal oxide particles can be exemplified.

The emitter terminal 31E is arranged between the other IGBT 101 and the other diode 111. The emitter terminal 31E is metal-joined to the emitter-side conductor 301. Accordingly, an output of the IGBT 101 is connected to the AC terminal 41 via the emitter-side conductor 301 and the emitter terminal 31E. That is, AC electric power output from the upper arm circuit 901 is transmitted to the AC terminal 41. As the metal joining, joining using a low-temperature sintered joining material mainly containing a solder material and metal oxide particles can be exemplified as with the collector terminal 21C side.

The floating terminal 51 is arranged between the collector terminal 21C and the emitter terminal 31E. The floating terminal 51 is arranged substantially in the middle between the collector terminal 21C and the emitter terminal 31E. In addition, the floating terminal 52 is arranged on the side of the emitter terminal 31E opposite to the floating terminal 51 side, and the floating terminal 53 is arranged on the side of the collector terminal 21C opposite to the floating terminal 51 side. Each of the floating terminals 51, 52, and 53 is formed of a metal conductor, is not connected to the collector-side conductor 201 and the emitter-side conductor 301, and is insulated.

Here, the floating means a state of being electrically floating and a state of being not electrically connected to any of the collector-side conductor 201 and the emitter-side conductor 301, being not connected to a ground portion, and indicating an independent potential.

The gate terminal 61 and the emitter sense terminal 71 are arranged on the side of the floating terminal 53 opposite to the collector terminal 21C. The gate terminal 61 and the emitter sense terminal 71 are arranged on the side of the floating terminal 52 opposite to the emitter terminal 31E. Each of the gate electrodes 161 of the two IGBTs 101 is connected to one or the other gate terminal 61 by a bonding wire (not illustrated). Each of the emitter sense electrodes 171 of the two IGBTs 101 is connected to one or the other emitter sense terminal 71 by a bonding wire (not illustrated).

As illustrated in FIG. 2, tip end sides of the gate terminals 61, the emitter sense terminals 71, the emitter terminal 31E, and the collector terminal 21C opposite to the IGBT 101 and diode 111 side are exposed from the sealing member 501, and root portions of the respective terminals exposed from the sealing member 501 are linearly arrayed.

The floating terminals 51 to 53 are entirely covered with the sealing member 501 from root-side end portions on the IGBT 101 and diode 111 side to tip end-side end portions. The tip end sides of the collector terminal 21C and the emitter terminal 31E of the IGBT 101 and the diode 111E are exposed from the sealing member 501. A protruding part 511 of the sealing member 501 is provided on an outer periphery of each of the floating terminals 51 to 53.

As illustrated in FIG. 2 and FIG. 5, each of the emitter terminal 31E and the collector terminal 21C is arranged between the protruding parts 511. Each of the floating terminals 51 to 53 is integrally molded with the sealing member 501. A tip end surface 54 of each of the floating terminals 51 to 53 is exposed from an end surface of each protruding part 511 of the sealing member 501.

As illustrated in FIG. 2 and FIG. 5, a rising part 141 bent substantially vertically toward the upper (the wide surface 501a of the sealing member 501) side and a horizontal part 142 bent substantially vertically from the rising part 141 so as to be parallel to the wide surface 501a of the sealing member 501 are formed on the tip end side of the collector terminal 21C exposed from the sealing member 501. The rising part 141 extends above an upper surface of each of the floating terminals 51 to 53, and the horizontal part 142 is positioned above the upper surface of each of the floating terminals 51 to 53.

In addition, a falling part 143 bent substantially vertically toward the lower (the wide surface 501b of the sealing member 501) side and a horizontal part 144 bent substantially vertically from the falling part 143 so as to be parallel to the wide surface 501b of the sealing member 501 are formed on the tip end side of the emitter terminal 31E exposed from the sealing member 501. The falling part 143 extends below a lower surface of each of the floating terminals 51 to 53, and the horizontal part 144 is positioned below the lower surface of each of the floating terminals 51 to 53.

The rising part 141 of the collector terminal 21C and the falling part 143 of the emitter terminal 31E are positioned on an inner side (the IGBT 101 and diode 111 side) of the tip end surface of each of the floating terminals 51 to 53. Thus, the rising part 141 of the collector terminal 21C and the falling part 143 of the emitter terminal 31E are bent and extended to the sides opposite to each other in the vertical direction with respect to the floating terminals 51 to 53 on the inner side of the tip end surface of each of the floating terminals 51 to 53, so that a creepage distance is increased.

It should be noted that, although both the emitter terminal 31E and the collector terminal 21C are exemplified as bent structures in the above description, only one of the emitter terminal 31E and the collector terminal 21C may be bent.

As described above, the floating terminal 51 is provided between the collector terminal 21C and the emitter terminal 31E in the present embodiment. Accordingly, the sealing member 501 of a region 510A between the collector terminal 21C and the emitter terminal 31E is divided into two regions of a region 51A between the collector terminal 21C and the floating terminal 51 and a region 51B between the emitter terminal 31E and the floating terminal 51.

In addition, the floating terminal 52 is provided between the emitter terminal 31E and one gate terminal 61. Accordingly, the sealing member 501 of a region 510B between the emitter terminal 31E and the floating terminal 52 is divided into two regions of a region 52A between the emitter terminal 31E and the floating terminal 52 and a region 52B between the gate terminal 61 and the floating terminal 52.

Further, the floating terminal 53 is provided between the collector terminal 21C and the other gate terminal 61. Accordingly, the sealing member 501 of a region 510C between the collector terminal 21C and the floating terminal 53 is divided into two regions of a region 53A between the gate terminal 61 and the floating terminal 53 and a region 53B between the collector terminal 21C and the floating terminal 53.

Thus, the floating terminals 51 to 53 are provided between terminals to which different voltages are applied to share the voltages applied between the terminals, and the corona start voltage of the entire system can be lowered by dividing the corona start voltage. Hereinafter, this will be described using FIG. 6 to FIG. 11.

Figure 6:
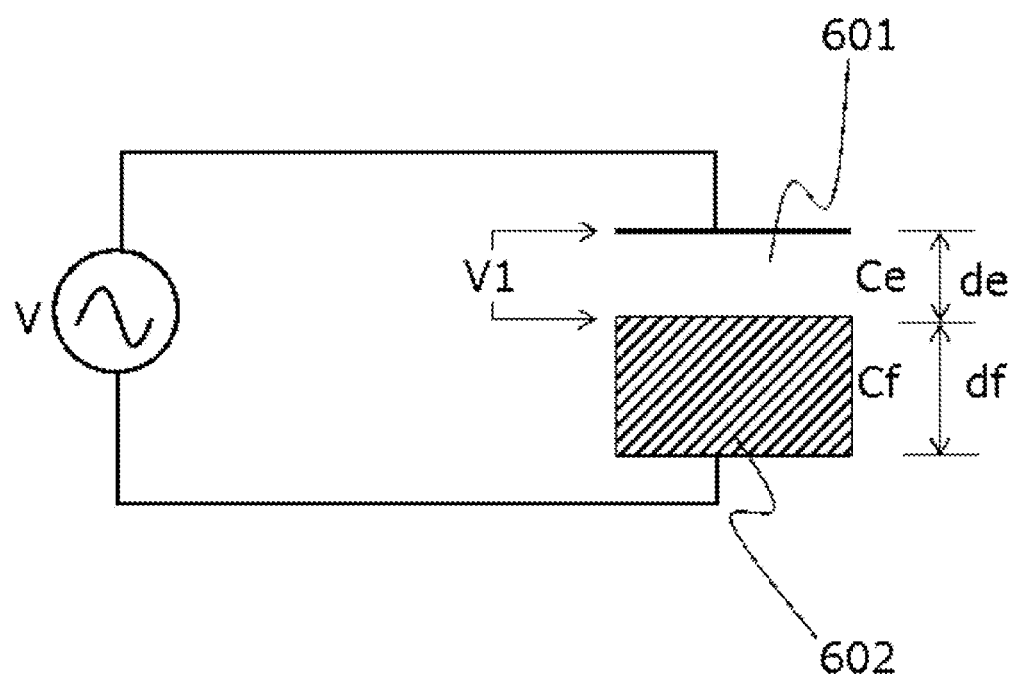
FIG. 6 is a diagram for showing a model of voltage sharing in a structure in which an air layer is interposed between an insulating layer and an electrode.

FIG. 6 is a diagram for showing a model of voltage sharing in the case where there is an air layer between an insulating layer and an electrode. An air layer 601 and an insulating layer 602 are configured between electrodes. When the AC voltage applied to the entire area between the electrodes is V and the voltage applied to the air layer in V is V1, the voltage V is represented by the equation (1). Note that Ce represents the capacity of the air layer, Cf represents the capacity of the insulating layer, $\varepsilon_0$ represents the dielectric constant of the vacuum, $\varepsilon$ represents the relative dielectric constant of the insulating layer, S represents the area of the electrode, de represents the thickness of the air layer, and df represents the thickness of the insulating layer.

$$V = V1 \cdot (Ce + Cf)/Cf \qquad \text{Equation (1)}$$

In addition, the equation an the equation are satisfied from the above definition.

$$Ce = \varepsilon_0 \cdot S/de \qquad \text{Equation (2)}$$

$$Cf = \varepsilon_0 \cdot \varepsilon \cdot S/df \qquad \text{Equation (3)}$$

From the equation (2) and the equation (3), the equation (1) becomes the equation (1a).

$$V = V1 \cdot (df/(\varepsilon \cdot de) + 1) \qquad \text{Equation (1a)}$$

As described above, when an air layer due to voids or peeling is generated on an interface between the electrode and the insulating layer or in the insulating layer, corona discharge occurs when a high voltage is applied between the electrodes. When the insulating layer is exposed to an environment of corona discharge, the residual wall portion is eroded by sparks due to the discharge, and the insulation performance is deteriorated. In particular, when the insulating portion is configured using a resin having lower heat resistance than that of ceramics or the like, the effect becomes remarkable. Thus, in order to improve the insulation performance of the insulating portion configured using a resin, it is effective to have a structure in which no corona discharge occurs.

In addition, the discharge phenomenon is different between the DC voltage and the AC voltage. In the case of the insulating layer against the DC voltage, since the insulating layer is charged and the electric field of a space becomes low after one discharge even under the condition where the corona discharge occurs, the discharge stops. Therefore, since the voltage is discharged only once, the influence of the discharge on the deterioration of the insulating layer is small. On the other hand, since the voltage applied to the insulating layer is inverted with the lapse of time under the AC voltage, the discharge is repeated. Therefore, the influence of the discharge on the deterioration of the insulating layer is large. Further, in the case where an AC waveform is produced by switching of the power semiconductor element, a surge voltage is superimposed on the AC waveform, so that a voltage higher than the rated voltage is applied to the insulating layer.

Figure 7:
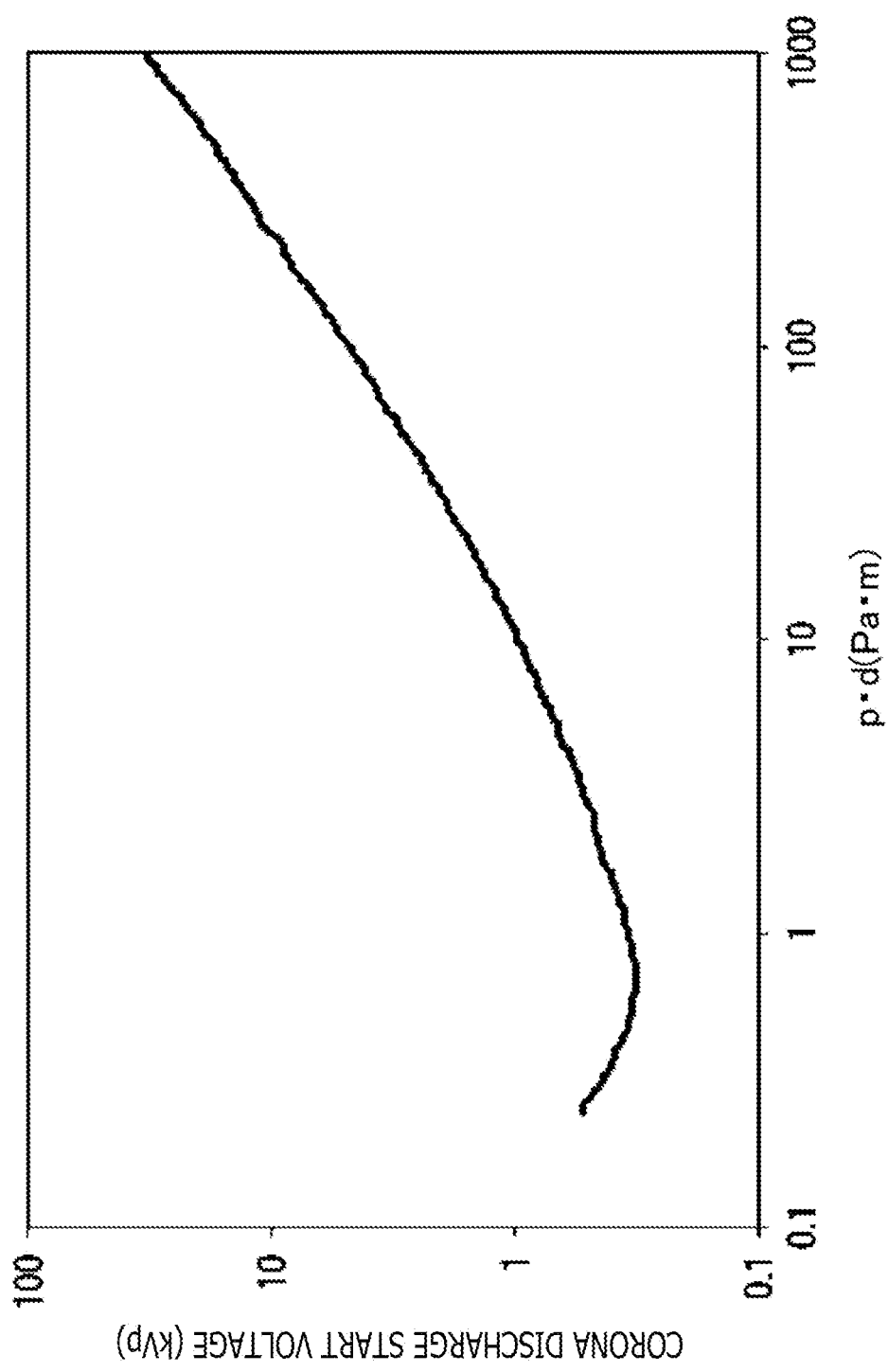
FIG. 7 is a characteristic diagram for showing a relation between a corona discharge start voltage according to the Paschen's law and the product of the atmospheric pressure and a distance between electrodes.

FIG. 7 is a characteristic diagram for showing a relation between a corona discharge start voltage according to the Paschen's law and the product of the atmospheric pressure and a distance between electrodes.

The voltage at which the corona discharge occurs will be described using FIG. 7. In the case where there is a gap between the electrodes, the Paschen's law shows that the voltage at which the corona discharge starts is expressed by a function of the atmospheric pressure and the gap length between the electrodes, and this fact has been subsequently confirmed theoretically and experimentally by a number of researchers. FIG. 7 is a diagram for showing the voltage at which the corona discharge occurs when a voltage is applied to electrodes having an interelectrode distance d at atmospheric pressure p in relation to the product of the atmospheric pressure p and the interelectrode distance d.

FIG. 7 shows the measurement at 20° C. As shown in FIG. 7, the corona discharge start voltage has the minimum value when the product p·d of the atmospheric pressure and the interelectrode distance is a certain value. That is, when a voltage exceeding the voltage as the minimum value of the corona discharge generation voltage is applied to the gap between the electrodes, the corona discharge occurs depending on the value of the product p·d.

Figure 8:
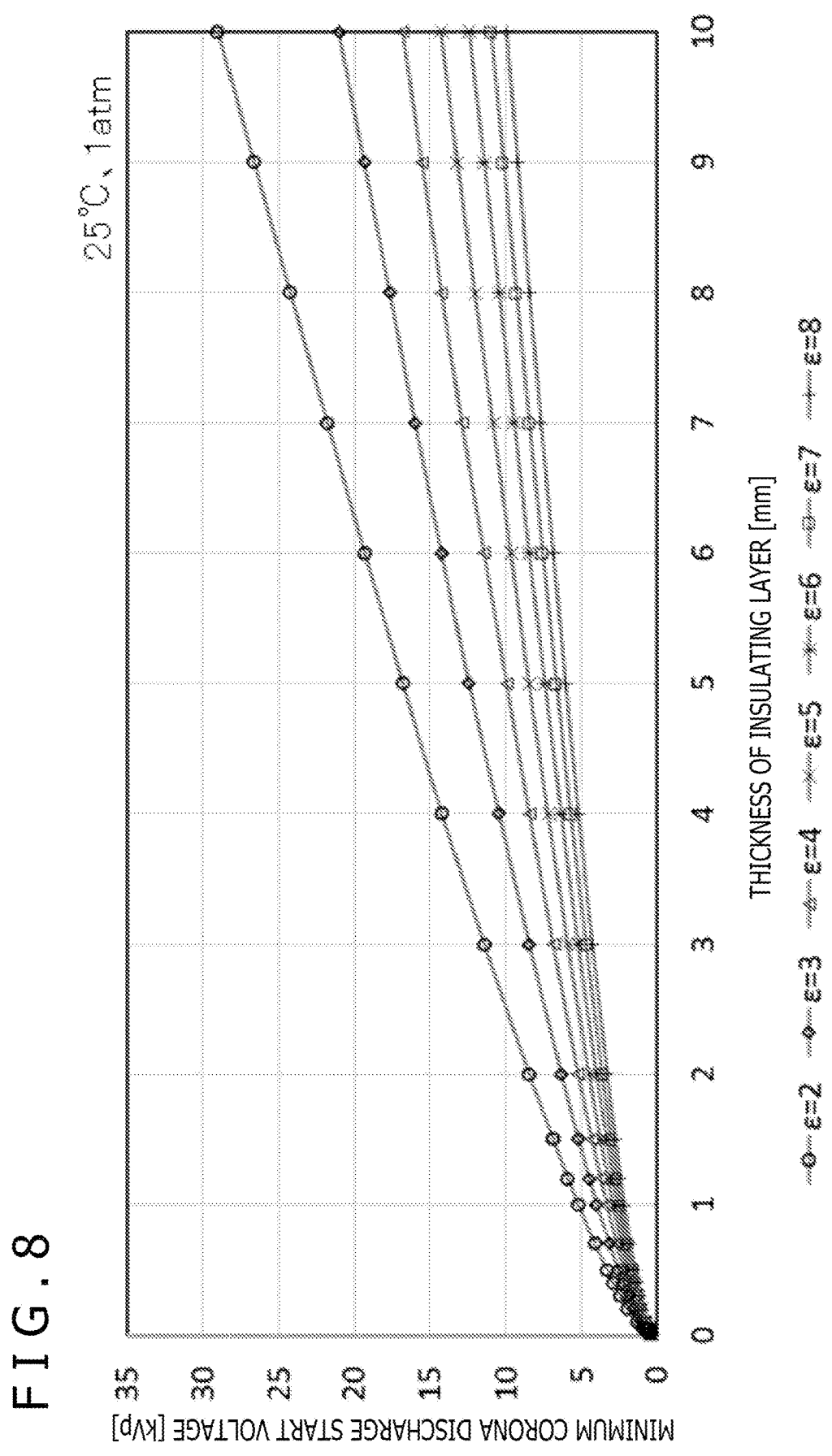
Figure 9:
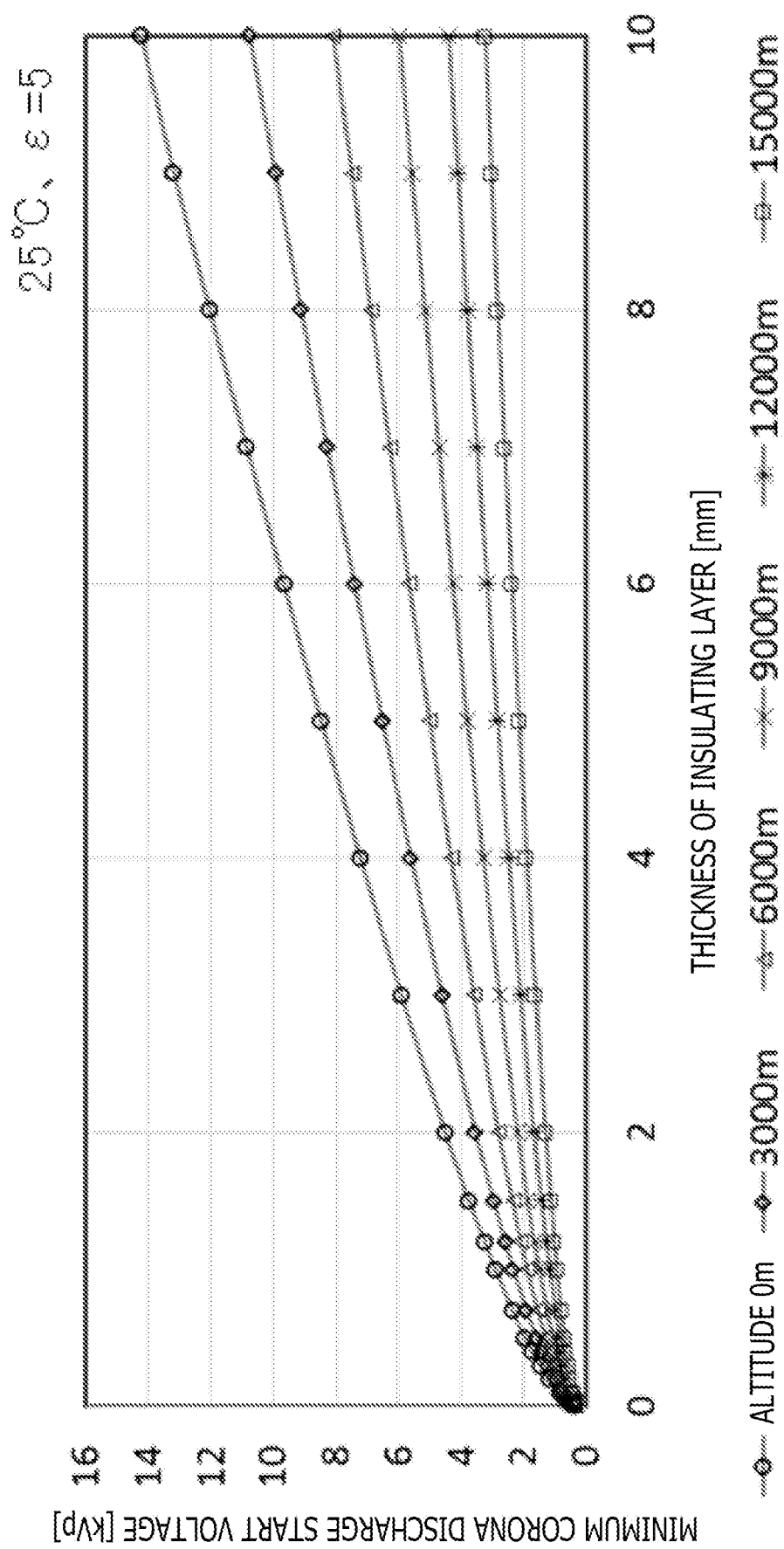
FIG. 9 is a characteristic diagram for showing a relation between the minimum corona discharge start voltage and the thickness of the insulating layer, and shows each characteristic in the case where the altitude is different.
Figure 10:
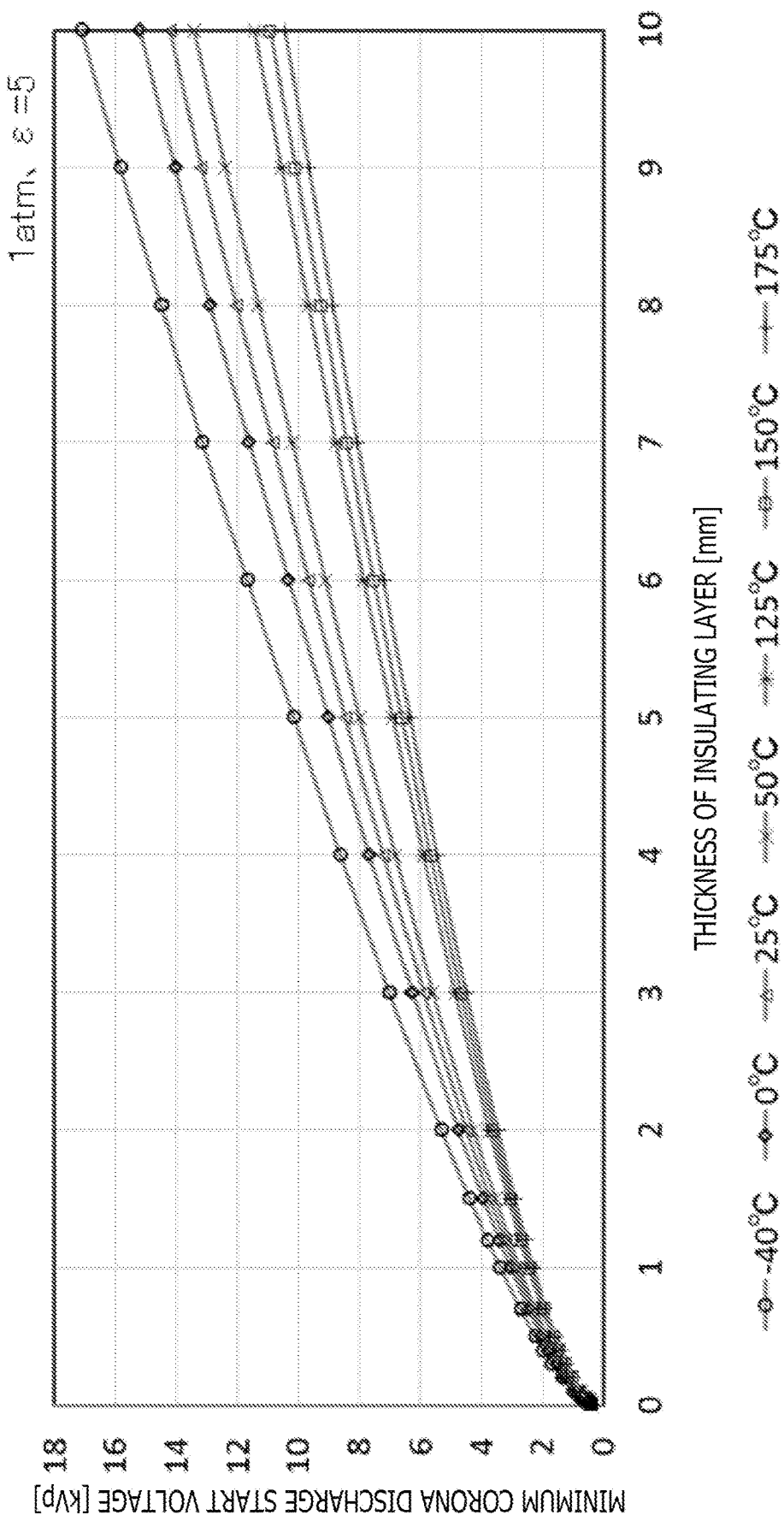
FIG. 10 is a characteristic diagram for showing a relation between the minimum corona discharge start voltage and the thickness of the insulating layer, and shows each characteristic in the case where the temperature is different.

Since the pressure according to the Paschen's law can be converted into the particle density of a gas, the corona discharge start voltage at any temperature and pressure can be obtained by using a gas state equation. When substituting the corona discharge start voltage thus obtained into V1 in the equation (1a), it is possible to calculate the minimum value of the interelectrode voltage V at which the discharge occurs in relation to the atmospheric pressure p and the thickness de of the air layer. FIG. 8 to FIG. 10 show diagrams in which the values of the minimum corona discharge start voltages thus calculated are plotted with respect to the thickness df of the insulating layer.

FIG. 8 is a characteristic diagram for showing a relation between the minimum corona discharge start voltage and the thickness of the insulating layer, and shows each characteristic in the case where the dielectric constant is different.

FIG. 8 shows a relation between the minimum corona discharge start voltage and the thickness df of the insulating layer at 25° C. and 1 atm. When the thickness df of the insulating layer increases, the voltage shared by the insulating layer 602 increases with respect to the voltage V, and thus the voltage V1 shared by the air layer 601 decreases. Therefore, as the thickness df of the insulating layer increases, the minimum corona discharge start voltage increases.

As shown in FIG. 8, the relation of the minimum corona discharge start voltage with respect to the thickness df of the insulating layer is not proportional. The inclination of the characteristic curve in a region where the thickness df of the insulating layer is small is larger than that of the characteristic curve in a region where the thickness df of the insulating layer is large. By utilizing this phenomenon, it is possible to reduce the thickness of the insulating layer and the distance between the terminals while securing the insulation property, as will be described later. In addition, it can be understood from FIG. 8 that the thickness df of the insulating layer 602 can be made smaller as the dielectric constant ε of the insulating layer 602 is lower at the same minimum corona discharge start voltage.

FIG. 9 is a characteristic diagram for showing a relation between the minimum corona discharge start voltage and the thickness of the insulating layer, and shows each characteristic in the case where the altitude is different.

FIG. 9 shows a relation between the minimum corona discharge start voltage and the thickness df of the insulating layer at 25° C. and a relative dielectric constant of 5 of the insulating layer. It can be understood from FIG. 9 that, as the altitude is higher and the atmospheric pressure is lower, the corona discharge start voltage becomes smaller. As a countermeasure, it is necessary to increase the thickness of the insulating layer as the altitude is higher and the atmospheric pressure is lower, and it is necessary to increase the distance between the terminals for this purpose.

FIG. 10 is a characteristic diagram for showing a relation between the minimum corona discharge start voltage and the thickness of the insulating layer, and shows each characteristic in the case where the temperature is different.

FIG. 10 shows a relation between the minimum corona discharge start voltage and the thickness df of the insulating layer at 1 atm and a relative dielectric constant of 5 of the insulating layer. It can be understood from FIG. 10 that, as the temperature is higher, the corona discharge start voltage becomes smaller. As a countermeasure, it is necessary to increase the thickness of the insulating layer as the temperature is higher, and it is necessary to increase the distance between the terminals for this purpose.

Figure 11:
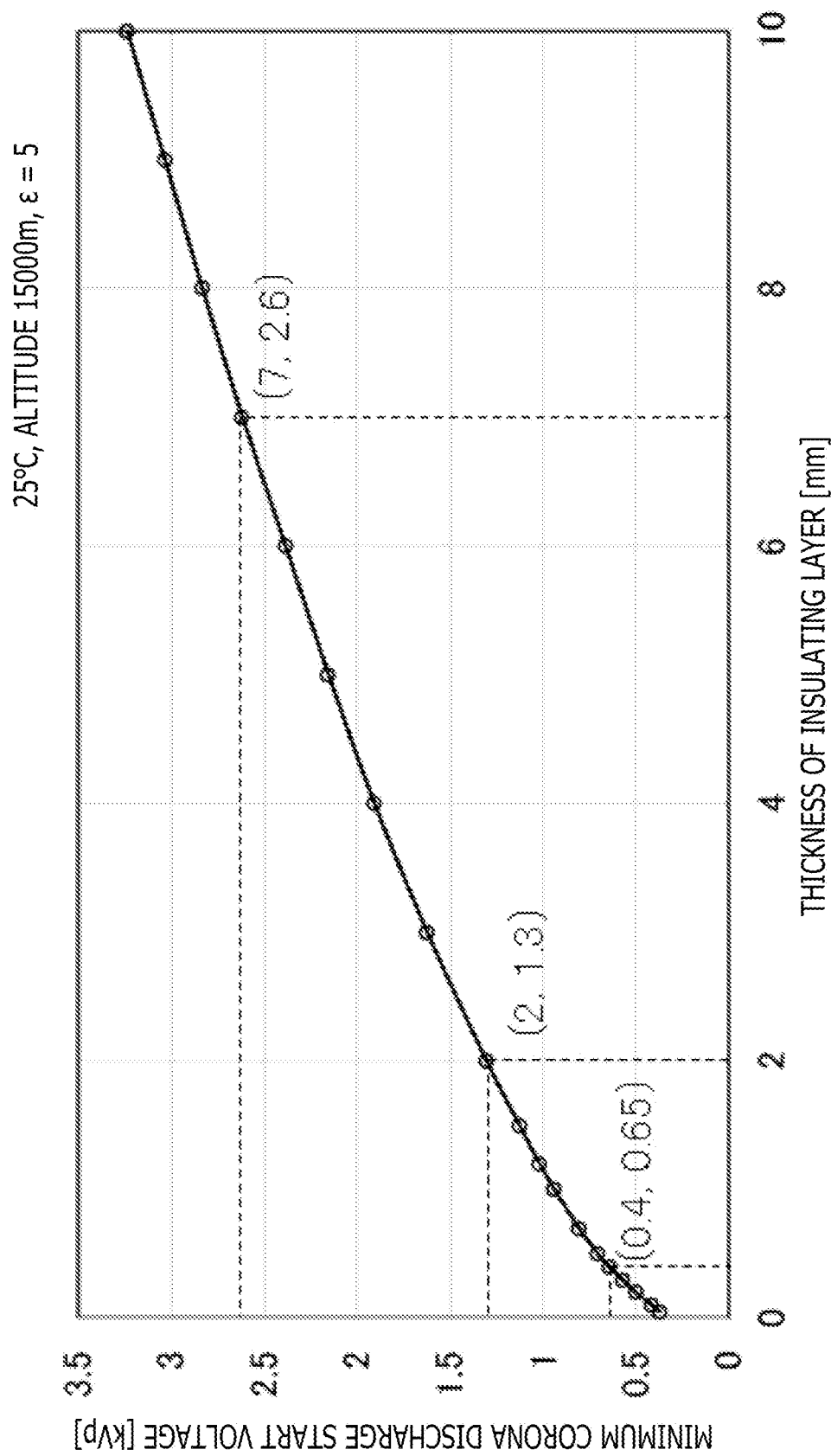
FIG. 11 is a characteristic diagram for showing a relation between the minimum corona discharge start voltage and the thickness of the insulating layer in a state where the dielectric constant, the altitude, and the temperature are set to be constant conditions.

FIG. 11 shows a relation between the minimum corona discharge voltage and the thickness df of the insulating layer at 25° C., an altitude of 15000 m (an atmospheric pressure of 0.1195), and a relative dielectric constant of 5. The principle of reducing the thickness (total thickness) df of the insulating layer 602 while suppressing the corona discharge will be described using FIG. 11.

For example, a case where a voltage of up to 2.6 kVp is applied between the electrodes is considered. According to FIG. 11, the minimum corona discharge voltage is 2.6 kVp when the thickness df of the insulating layer is 7 mm, and thus, even if a gap is generated due to peeling or the like, the corona discharge does not occur as long as the thickness of the insulating layer is formed larger than 7 mm.

In addition, when the voltage applied between the electrodes is 1.3 kVp, the corona discharge does not occur as long as the thickness df of the insulating layer is larger than 2 mm according to FIG. 11. The thickness df (=2 mm) of the insulating layer is smaller than ½ of the thickness df (=7 mm) of the insulating layer when the minimum corona discharge voltage is 2.6 kVp that is twice. This is because, as described above, the relation between the minimum corona discharge voltage and the thickness df of the insulating layer is not proportional, but the inclination of the characteristic curve becomes larger in a region where the thickness df of the insulating layer is smaller, and the inclination of the characteristic curve becomes smaller as the thickness df of the insulating layer increases.

Therefore, even if the voltage is 2.6 kVp, the discharge can be suppressed if insulating layers each thicker than 2 mm are provided by dividing the voltage into 1.3 kVp and 1.3 kVp. Accordingly, in the case where the area between the electrodes is not divided by the conductive members, the thickness (total thickness) of the insulating layer that is required to be 7 mm can be reduced to 4 mm.

In the present embodiment, as shown in FIG. 5, the floating terminals 51, 52, and 53 are inserted between the collector terminal 21C and the emitter terminal 31E, between the collector terminal 21C and one gate terminal 61, and between the emitter terminal 31E and the other gate terminal 61, respectively.

In this structure, the floating terminals 51, 52, and 53 divide the thickness of the sealing member 501 in the region between the collector terminal 21C and the emitter terminal 31E, the thickness of the sealing member 501 in the region between the collector terminal 21C and one gate terminal 61, and the thickness of the sealing member 501 in the region between the emitter terminal 31E and the other gate terminal 61 into two, respectively. Accordingly, the thickness of the insulating layer can be reduced.

As an example, if the minimum corona discharge voltage between the collector terminal 21C and the emitter terminal 31E is 2.6 kVp, the thickness of the sealing member 501 in the region is required to be 7 mm or more when the floating terminal 51 is not provided, but it is sufficient if the thickness is 4 mm (=2 mm×2) or more by providing the floating terminal 51. The same applies to the thickness of the sealing member 501 in the region between the collector terminal 21C and one gate terminal 61 and the thickness of the sealing member 501 in the region between the emitter terminal 31E and the other gate terminal 61.

Further, with reference to FIG. 11, when the minimum corona discharge voltage is 0.65 kVp, the thickness df of the insulating layer is 0.4 mm. Since 0.65 kVp of the minimum corona discharge voltage is ¼ of 2.6 kVp of the minimum corona discharge voltage, if the thickness df of the insulating layer is divided into four, the minimum corona discharge voltage of each divided region is 0.65 kVp.

For example, if three floating terminals 51 are provided between the collector terminal 21C and the emitter terminal 31E and the region between the collector terminal 21C and the emitter terminal 31E is divided into four equal portions, the voltage between the terminals among the divided regions becomes ¼. In the structure in which the region between the collector terminal 21C and the emitter terminal 31E is divided into four equal portions, if the minimum corona discharge voltage between the collector terminal 21C and the emitter terminal 31E is 2.6 kVp when no floating terminals 51 are provided, the thickness of the sealing member 501 in each divided region can be 0.4 mm, and the total thickness can be 1.6 mm (=0.4×4).

The same applies to the thickness of the sealing member 501 in the region between the collector terminal 21C and one gate terminal 61 and the thickness of the sealing member 501 in the region between the emitter terminal 31E and the other gate terminal 61.

That is, as the number of floating terminals 51 to 53 provided between the terminals to which the voltage V is applied increases, the thickness of the insulating layer can be reduced.

The semiconductor device can be downsized by reducing the thickness of the insulating layer and reducing the interval between the terminals, and the inductance can be accordingly reduced to achieve the low loss of the electric power conversion device.

In the above-described embodiment, the voltage V applied between the emitter terminal 31E and the collector terminal 21C is divided by providing the floating terminal 51 between the emitter terminal 31E for transmitting AC electric power and the collector terminal 21C for transmitting DC electric power. Therefore, the corona discharge start voltage can be increased and the distance between the terminals can be reduced. Similarly, the distance between the terminals is reduced by providing the floating terminals 52 and 53 between one gate terminal 61 and the emitter terminal 31E for transmitting AC electric power and between the other gate terminal 61 and the collector terminal 21C for transmitting DC electric power, respectively.

Accordingly, the semiconductor device 900 can be downsized and the loss due to lowering of the inductance can be reduced. It is preferable that the floating terminals 51, 52, and 53 are arranged so as to equalize the intervals between the emitter terminal 31E and the collector terminal 21C, between one gate terminal 61 and the emitter terminal 31E, and between the other gate terminal 61 and the collector terminal 21C, respectively, because the minimum corona discharge start voltage of the entire system can be increased.

Next, an example of a manufacturing method of a semiconductor device according to the present embodiment will be described with reference to FIG. 12 to FIG. 14.

Figure 12:
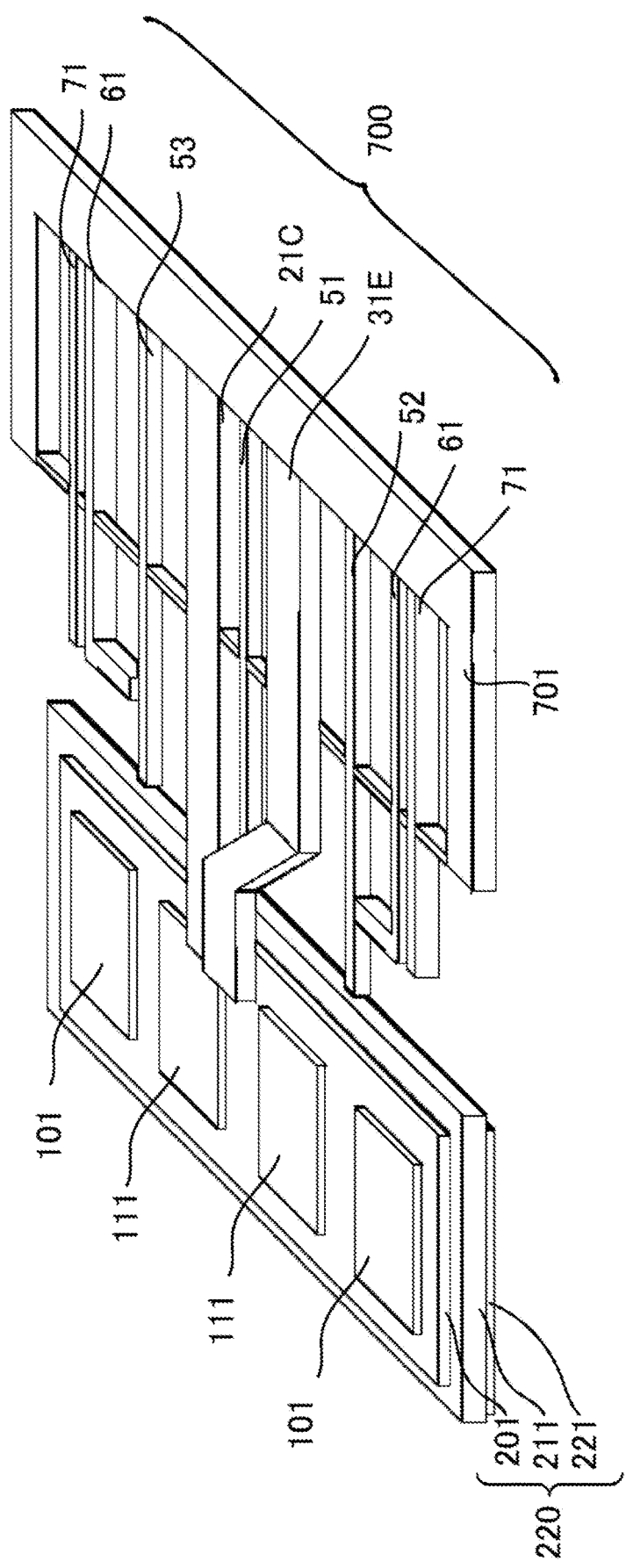
FIG. 12 is a perspective view for showing an initial process in a manufacturing method of the semiconductor device illustrated in FIG. 2.
Figure 13:
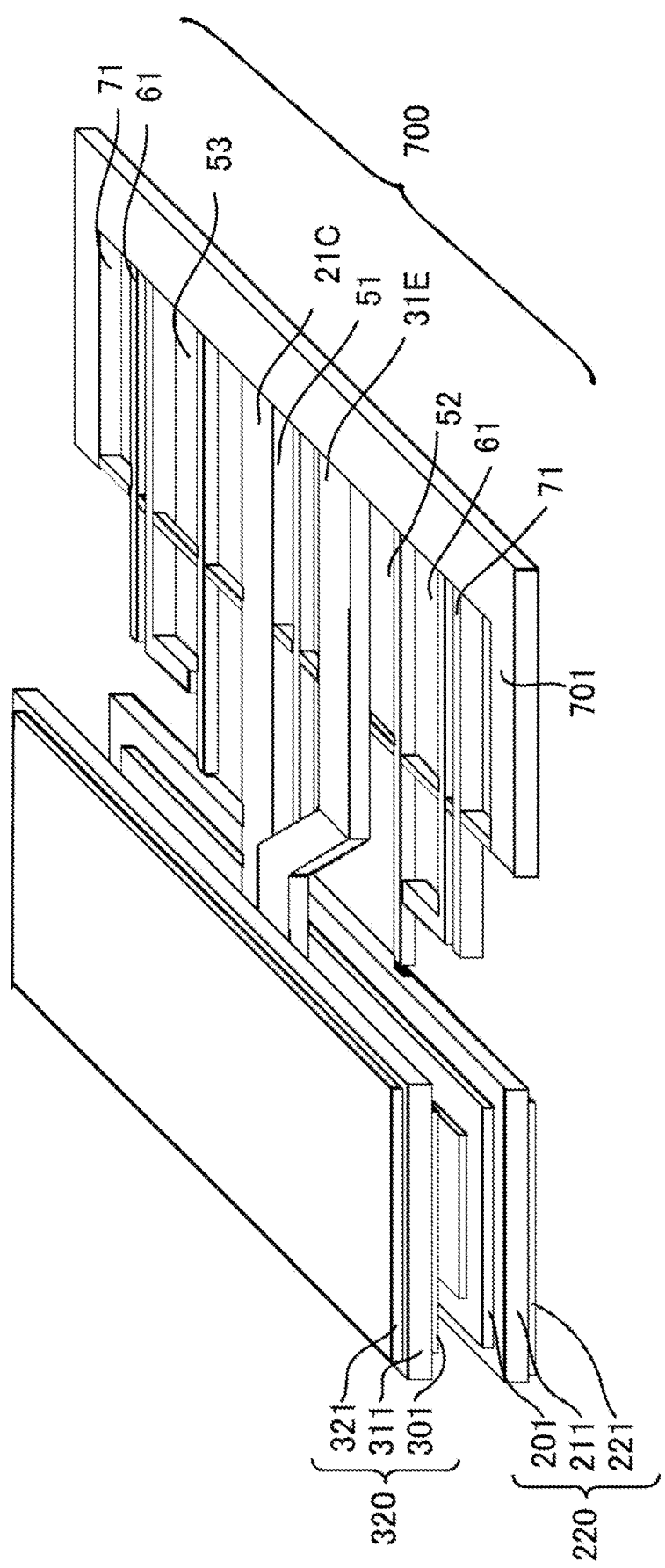
FIG. 13 is a perspective view for showing a process subsequent to FIG. 12.
Figure 14:
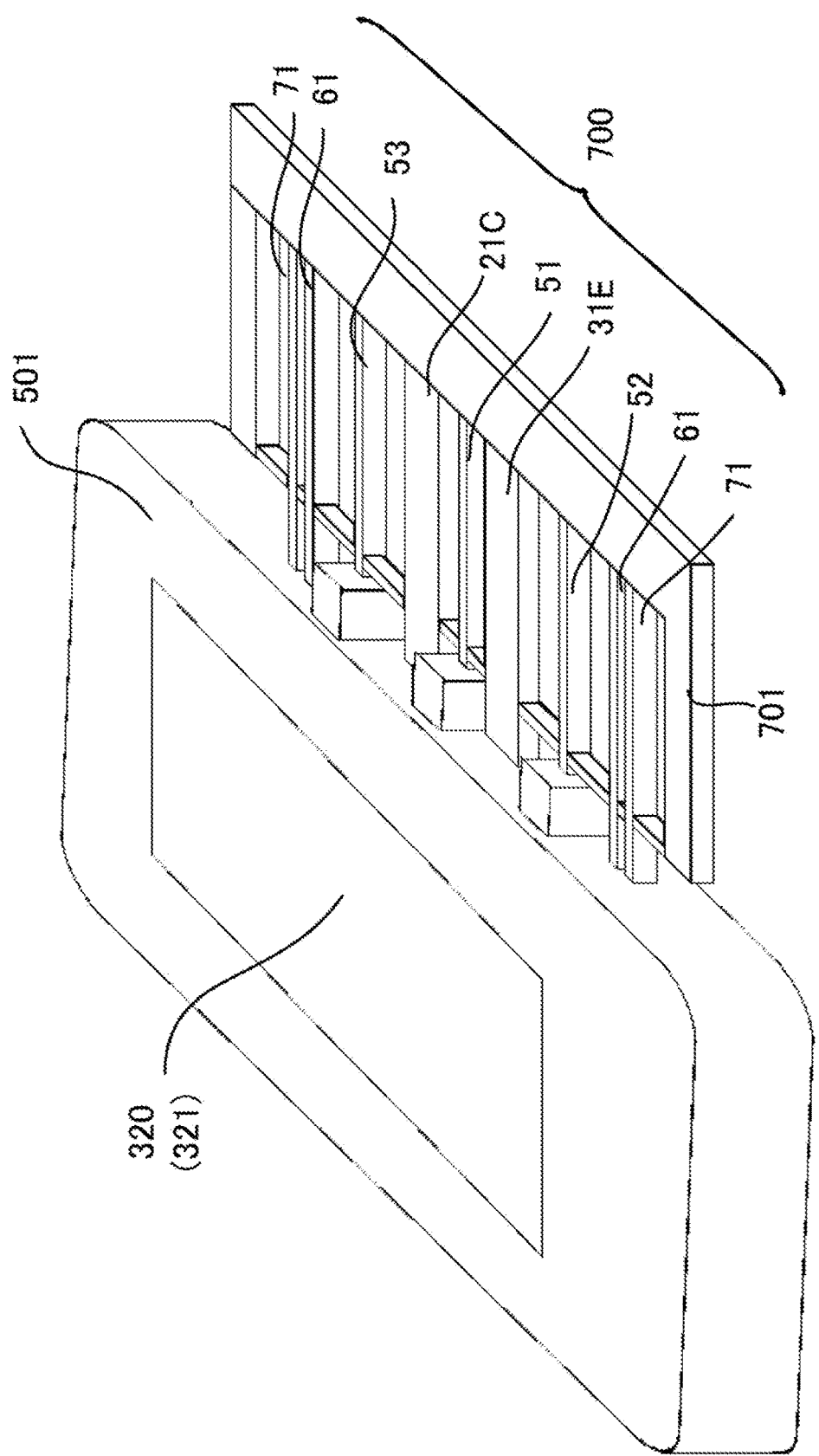
FIG. 14 is a perspective view for showing a process subsequent to FIG. 13.

FIG. 12 is a perspective view for showing an initial process in a manufacturing method of the semiconductor device illustrated in FIG. 2, FIG. 13 is a perspective view for showing a process subsequent to FIG. 12, and FIG. 14 is a perspective view for showing a process subsequent to FIG. 13.

As illustrated in FIG. 12, the collector-side conductor 201 and the insulating layer 211, and the insulating layer 211 and the metallization layer 221 are joined to each other in advance to form the collector-side mounting part 220. The joining of the collector-side conductor 201 and the insulating layer 211 and the joining of the insulating layer 211 and the metallization layer 221 are performed by using, for example, a brazing material.

Similarly, the emitter-side conductor 301 and the insulating layer 311, and the insulating layer 311 and the metallization layer 321 are joined to each other in advance to form the emitter-side mounting part 320. The joining of the emitter-side conductor 301 and the insulating layer 311 and the joining of the insulating layer 311 and the metallization layer 321 are performed by using, for example, a brazing material as with the case of the collector-side mounting part 220.

Next, the collector electrodes 121 of the two IGBTs 101 and the cathode electrodes of the two diodes 111 are joined to the collector-side conductor 201. As described above, the joining can be performed by metal joining using a low-temperature sintered joining material mainly containing a solder material, fine metal particles, and metal oxide particles.

As the solder material, a solder whose main component is tin, bismuth, zinc, gold, or the like having a melting point higher than the curing temperature of the sealing member 501 can be used. The fine metal particles are silver or copper fine particles coated with a flocculation protection material, and particularly, a flocculation protection material that can be removed at a low temperature equivalent to that of a solder material can be applied. As the metal oxide particles, metal oxide that can be reduced at a low temperature equivalent to that of a solder material such as silver oxide and copper oxide can be applied. In the case where fine silver particles, fine copper particles, silver oxide, and copper oxide particles are used, the metal joint becomes a sintered silver layer or a sintered copper layer. The joining is performed by heating at 200° C. to 350° C. in a hydrogen or inert atmosphere.

After the collector electrode 121 of the IGBT 101 and the cathode electrode of the diode 111 are joined to the collector-side conductor 201, the insulating layer 211 and the metallization layer 221 may be joined to the collector-side conductor 201. As described above, a composite layer made of metal particles having low thermal expansion and high thermal conductivity may be provided between the collector-side conductor 201 and the insulating layer 211 and/or between the emitter-side conductor 301 and the insulating layer 311. Similarly, a composite layer made of metal particles having low thermal expansion and high thermal conductivity may be provided between the metallization layer 221 and the insulating layer 211 and/or between the metallization layer 321 and the insulating layer 311.

As illustrated in FIG. 12, the collector terminal 21C, the emitter terminal 31E, the floating terminals 51, 52, and 53, the two gate terminals 61, and the two emitter sense terminals 71 are integrally formed as a lead frame 700 coupled by a tie bar 701. The root-side end portion, on the IGBT 101 and diode 111 side, of the collector terminal 21C integrated with the lead frame 700 is joined to the collector-side conductor 201. The collector terminal 21C and the collector-side conductor 201 are joined to each other by, for example, metal joining using a low-temperature sintered joining material mainly containing a solder material, fine metal particles, and metal oxide particles. Since the floating terminals 51, 52, and 53 are integrated with the collector terminal 21C and the emitter terminal 31E, the positional accuracy between the respective terminals can be enhanced.

In addition, although not illustrated in the drawing, the gate electrode 161 of each IGBT 101 and each gate terminal 61 are connected to each other by a bonding wire. Similarly, the emitter sense electrode 171 of each IGBT 101 and each emitter sense terminal 71 are connected to each other by a bonding wire. For the wire used for the bonding wire, a material having small electric resistance such as aluminum or copper is used.

Then, as illustrated in FIG. 13, the emitter-side conductor 301 of the emitter-side mounting part 320 is joined to the emitter electrodes 131 of the two IGBTs 101 and the anode electrodes (not illustrated) of the two diodes 111. In addition, the root-side end portion of the emitter terminal 31E integrated with the lead frame 700 is joined to the emitter-side conductor 301. The joining of the emitter-side conductor 301 to the emitter electrode 131 and the anode electrode and the joining of the emitter-side conductor 301 and the emitter terminal 31E are performed by, for example, metal joining using a low-temperature sintered joining material mainly containing a solder material, fine metal particles, and metal oxide particles, as with the case of the collector-side mounting part 220 side.

Next, as illustrated in FIG. 14, the collector-side mounting part 220 and the emitter-side mounting part 320 sandwiching the IGBTs 101 and the diodes 111 from the upper side and the lower side are sealed with the sealing member 501. The sealing with the sealing member 501 is performed by, for example, transfer molding. The sealing is performed in such a manner that the metallization layer 221 of the collector-side mounting part 220 is exposed from the wide surface 501b of the sealing member 501 and the metallization layer 321 of the emitter-side mounting part 320 is exposed from the wide surface 501a of the sealing member 501. In addition, the sealing is performed in such a manner that the outer periphery of each of the floating terminals 51, 52, and 53 is covered with the protruding part 511 of the sealing member 501 and the tip end surface 54 of each of the floating terminals 51, 52, and 53 is exposed from the protruding part 511 of the sealing member 501.

As the sealing member 501, for example, a resin based on adhesive novolac, polyfunctional biphenyl, phenolic epoxy resin, bismaleimide triazine, or cyanate ester can be used. It is preferable that ceramics such as $SiO_2$, $Al_2O_3$, AlN, or BN, or a filler such as gel or rubber be contained in these resins. By containing such a filler, the thermal expansion coefficient is made closer to the IGBTs 101, the collector-side conductor 201, and the emitter-side conductor 301 to reduce the difference in the thermal expansion coefficient. Accordingly, the thermal stress generated with the temperature rise in the use environment is significantly reduced, and the life of the semiconductor device 900 can be prolonged.

Before the sealing using the above-described resin for the sealing member 501, it is preferable that outer surfaces of the collector-side conductor 201, the emitter-side conductor 301, the insulating layers 211 and 311, the metallization layers 221 and 321, the IGBTs 101, and the diodes 111, and outer surfaces and joints of the respective terminals integrally formed with the lead frame 700 be subjected to a process for improving the adhesion strength with the sealing member 501. As the process for improving the adhesion strength with the sealing member 501, for example, a method of forming a coating film of polyamideimide, polyimide, or the like can be exemplified.

Thereafter, the tie bar 701 of the lead frame 700 illustrated in FIG. 14 is cut, and the collector terminal 21C, the emitter terminal 31E, the floating terminals 51, 52, and 53, the two gate terminals 61, and the two emitter sense terminals 71 are separated.

Then, as illustrated in FIG. 2, the collector terminal 21C is bent such that the rising part 141 rising upward and the horizontal part 142 bent vertically from the rising part 141 are formed. Similarly, the emitter terminal 31E is bent such that the falling part 143 bent downward and the horizontal part 144 bent vertically from the falling part 143 are formed.

Accordingly, the semiconductor device 900 illustrated in FIG. 2 can be obtained.

In the above description, the region 510A of the sealing member 501 between the collector terminal 21C and the emitter terminal 31E is divided into the region 51A and the region 51B by providing the floating terminal 51 between the emitter terminal 31E for transmitting AC electric power and the collector terminal 21C for transmitting DC electric power. Accordingly, the corona discharge start voltage can be increased, and the thickness of the sealing member 501, that is, the distance between the terminals can be reduced.

Similarly, the region 510B of the sealing member 501 between the emitter terminal 31E and the floating terminal 52 is divided into the region 52A and the region 52B by providing the floating terminal 52 between one gate terminal 61 and the emitter terminal 31E for transmitting AC electric power. In addition, the region 510C of the sealing member 501 between the collector terminal 21C and the floating terminal 53 is divided into the region 53A and the region 53B by providing the floating terminal 53 between the collector terminal 21C and the other gate terminal 61. Thus, the thickness of the sealing member 501, that is, the distance between the terminals can be further reduced.

It should be noted that, as described above, the deterioration of the insulating layer due to the corona discharge is greater between the terminals to which the AC voltage is applied than between the terminals to which the DC voltage is applied. Therefore, the floating terminals 51 and 52 may be provided between the emitter terminal 31E and the collector terminal 21C and between the emitter terminal 31E and one gate terminal 61, respectively, and it is not necessary to provide the floating terminal 53 between the collector terminal 21C and the other gate terminal 61.

The semiconductor device 900 having the upper arm circuit 901 has been described above. However, as described above, the semiconductor device 900A having the lower arm circuit 902 can be formed with a structure similar to that of the semiconductor device 900 by replacing each terminal with a member corresponding to the semiconductor device 900.

Here, the emitter terminal 31E serves as an AC terminal in the semiconductor device 900 having the upper arm circuit. Therefore, in the semiconductor device 900 having the upper arm circuit, it is necessary to provide the floating terminals 51 and 52 between the emitter terminal 31E and the collector terminal 21C and between the emitter terminal 31E and one gate terminal 61, respectively.

On the other hand, the collector terminal 22C serves as an AC terminal in the semiconductor device 900A having the lower arm circuit. Therefore, in the semiconductor device 900A having the lower arm circuit, it is necessary to provide the floating terminals 51 and 53 between the emitter terminal 32E and the collector terminal 22C and between the collector terminal 22C and the other gate terminal 61, respectively.

However, with this configuration, the semiconductor device 900 having the upper arm circuit and the semiconductor device 900A having the lower arm circuit have different shapes. On the other hand, the semiconductor device 900 having the upper arm circuit 901 is structured to have the floating terminals 51, 52, and 53 between the emitter terminal 31E and the collector terminal 21C, between the emitter terminal 31E and one gate terminal 61, and between the collector terminal 21C and the other gate terminal 61, respectively. In addition, the semiconductor device 900A having the lower arm circuit 902 is structured to have the floating terminals 51, 52, and 53 between the emitter terminal 32E and the collector terminal 22C, between the emitter terminal 32E and one gate terminal 61, and between the collector terminal 22C and the other gate terminal 61, respectively. Thus, the semiconductor device 900 and the semiconductor device 900A can have the same shape, a same assembling apparatus can be used, and the assembling efficiency can be improved.

According to the above-described embodiment, the following effects are exhibited.

(1) The semiconductor device 900 includes: the IGBT 101 (semiconductor element) that converts DC electric power into AC electric power; the collector terminal 21C (DC terminal) that transmits DC electric power; the emitter terminal 31E (AC terminal) that transmits AC electric power; the sealing member 501 that seals the IGBT 101, at least a part of the collector terminal 21C, and at least a part of the emitter terminal 31E; and at least one floating terminal 51 that is arranged between the collector terminal 21C and the emitter terminal 31E. Therefore, the sealing member 501 in the region between the collector terminal 21C and the emitter terminal 31E is divided into two or more by the floating terminal 51, and the voltage applied between the terminals is reduced. Therefore, even if the thickness of the sealing member 501 in the region between the collector terminal 21C and the emitter terminal 31E is reduced, the occurrence of the corona discharge can be suppressed, and the semiconductor device 900 can be downsized. In addition, along with the downsizing of the semiconductor device 900, the inductance becomes low, and there is an effect that the loss of the electric power conversion device can be reduced.

(2) The manufacturing method of the semiconductor device includes: connecting each of the collector terminal 21C (DC terminal) and the emitter terminal 31E (AC terminal) to the IGBT 101 (semiconductor element) that converts DC electric power into AC electric power; sealing the IGBT 101 and at least a part of each of the collector terminal 21C and the emitter terminal 31E with the sealing member 501; and providing at least one floating terminal 51 between the collector terminal 21C and the emitter terminal 31E. Therefore, the sealing member 501 in the region between the collector terminal 21C and the emitter terminal 31E is divided into two or more by the floating terminal 51, and the voltage applied between the terminals is reduced. Therefore, even if the thickness of the sealing member 501 in the region between the collector terminal 21C and the emitter terminal 31E is reduced, the occurrence of the corona discharge can be suppressed, and the semiconductor device 900 can be downsized. In addition, along with the downsizing of the semiconductor device 900, the inductance becomes low, and there is an effect that the loss of the electric power conversion device can be reduced.

(3) In the manufacturing method of the semiconductor device, providing the floating terminal 51 includes: forming the lead frame 700 in which the floating terminal 51 is integrated with the collector terminal 21C and the emitter terminal 31E; sealing a part of each of the collector terminal 21C, the emitter terminal 31E, and the floating terminal 51 of the lead frame 700 with the sealing member 501; and separating the collector terminal 21C, the emitter terminal 31E, and the floating terminal 51 from each other by cutting the lead frame 700. Since the floating terminal 51, the collector terminal 21C, and the emitter terminal 31E are sealed in an integrated state as the lead frame 700, the positional accuracy of each terminal can be improved.

Second Embodiment

Figure 15:
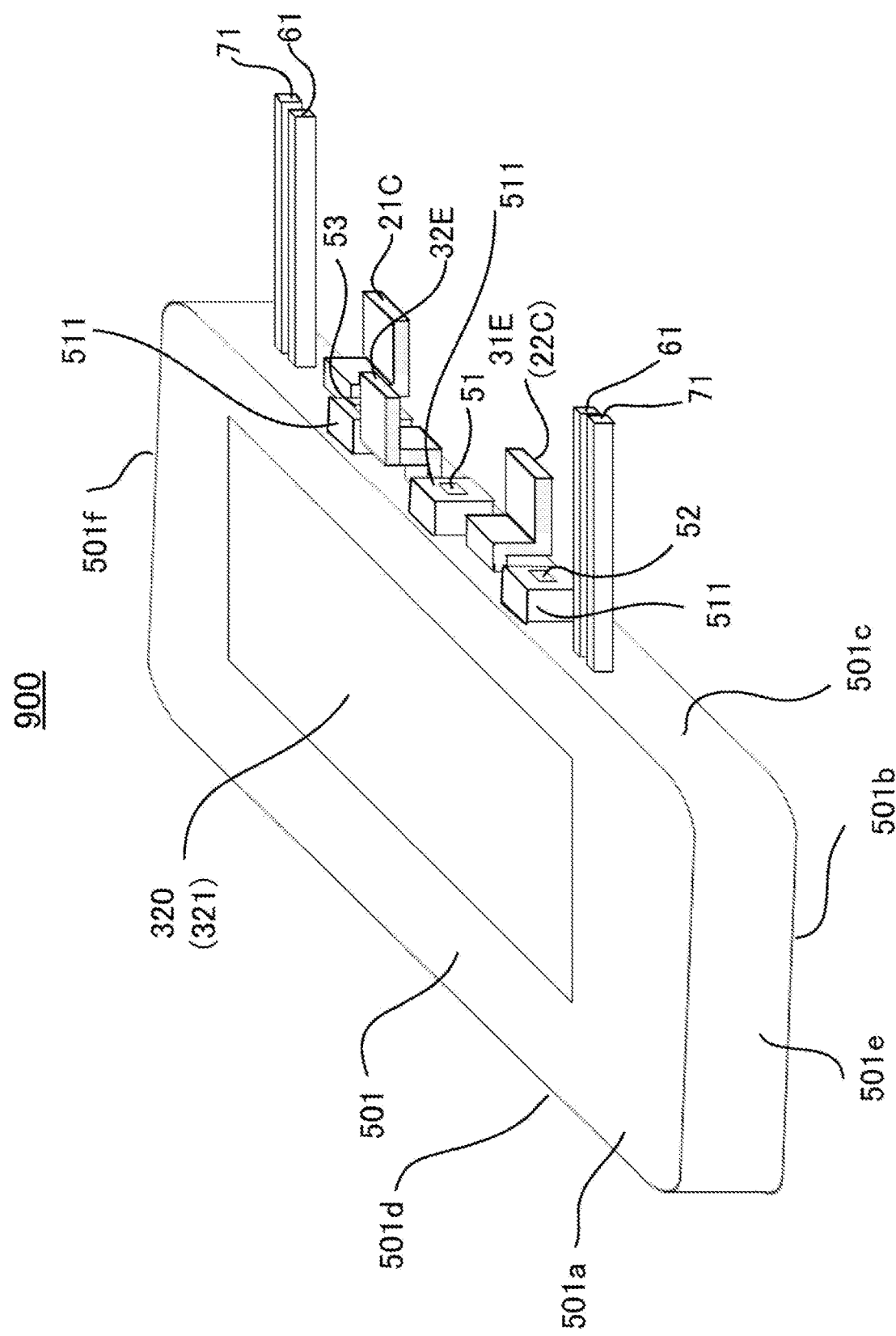
FIG. 15 is an external perspective view for showing a second embodiment of the semiconductor device of the present invention.
Figure 16:
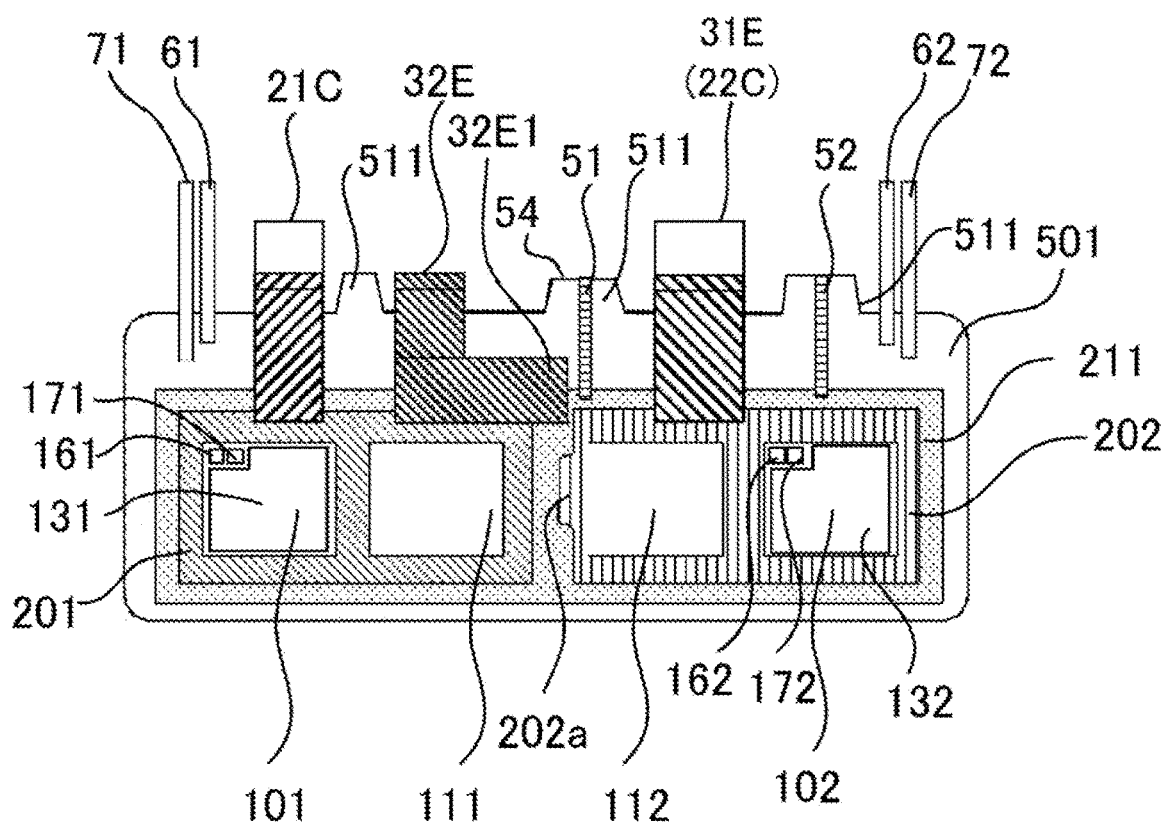
FIG. 16 is a plan view of the semiconductor device illustrated in FIG. 15 by seeing through an emitter-side mounting part from the upper surface side.

FIG. 15 is an external perspective view for showing a second embodiment of the semiconductor device of the present invention, and FIG. 16 is a plan view of the semiconductor device illustrated in FIG. 15 by seeing through an emitter-side mounting part from the upper surface side.

A semiconductor device 900 of the second embodiment is a 2-in-1 power semiconductor module having an upper arm circuit 901 and a lower arm circuit 902.

That is, the semiconductor device 900 of the second embodiment has IGBTs 101 and 102, diodes 111 and 112, a collector terminal 21C, an emitter terminal 32E, an emitter terminal 31E (collector terminal 22C), gate terminals 61 and 62, and emitter sense terminals 71 and 72. As illustrated in FIG. 1, the IGBT 101 has the gate electrode 161, the collector electrode 121, the emitter electrode 131, and the emitter sense electrode 171, and the IGBT 102 has the gate electrode 162, the collector electrode 122, the emitter electrode 132, and the emitter sense electrode 172. The emitter terminal 31E is connected to the emitter electrode 131 of the IGBT 101 and the collector electrode 122 of the IGBT 102, and is also the collector terminal 22C, but will be hereinafter referred to as the emitter terminal 31E.

From a side surface 501c of a sealing member 501, the collector terminal 21C, the emitter terminal 32E, the emitter terminal 31E (collector terminal 22C), the gate terminals 61 and 62, and the emitter sense terminals 71 and 72 protrude.

As illustrated in FIG. 16, the collector electrode 121 of the IGBT 101 and the cathode electrode of the diode 111 are joined to a collector-side conductor 201, and the collector electrode 122 of the IGBT 102 and the cathode electrode of the diode 112 are joined to a collector-side conductor 202. One end of the collector terminal 21C is joined to the collector-side conductor 201. A battery 802 and a positive-side capacitor terminal 811 of a capacitor module 801 are connected to the other end of the collector terminal 21C.

Similarly to FIG. 2, an emitter-side conductor 301 is provided opposite to the collector-side conductor 201. Although not illustrated in the drawing, an emitter-side conductor 302 is provided opposite to the collector-side conductor 202. The emitter-side conductor 301 and the collector-side conductor 202 are electrically connected to each other by an intermediate conductor 202a obtained by bending an end portion of the collector-side conductor 202 toward the emitter side conductor 301.

The emitter electrode 131 of the IGBT 101 and the anode electrode of the diode 111 are joined to the emitter-side conductor 301. The emitter electrode 132 of the IGBT 102 and the anode electrode of the diode 112 are joined to the emitter-side conductor 302 (not illustrated).

A root-side end portion of the emitter terminal 32E on the diode 111 side is insulated from the emitter-side conductor 301 and extends to the emitter-side conductor 302 side, and a tip end portion 32E1 extended is joined to the emitter-side conductor 302. The battery 802 and a negative-side capacitor terminal 812 of the capacitor module 801 are connected to the other end of the emitter terminal 32E.

One end of the emitter terminal 31E is joined to the collector-side conductor 202. Since the emitter-side conductor 301 and the collector-side conductor 202 are connected to each other by the intermediate conductor 202a, one end of the emitter terminal 31E is also electrically connected to the emitter-side conductor 301.

An AC terminal 41 (see FIG. 1) electrically connected to a motor generator 400 is connected to the other end of the emitter terminal 31E.

It should be noted that the collector-side conductor 202 and the emitter-side conductor 302 are illustrated in the circuit diagram of FIG. 1.

The gate terminal 61 and the emitter sense terminal 71 are provided on the side of the collector terminal 21C opposite to the emitter terminal 32E. The gate terminal 62 and the emitter sense terminal 72 are provided on the side of the emitter terminal 31E opposite to the emitter terminal 32E.

Although not illustrated in the drawing, the gate electrode 161 and the emitter sense electrode 171 of the IGBT 101 are connected to the gate terminal 61 and the emitter sense terminal 71 by bonding wires, respectively. In addition, the gate electrode 162 and the emitter sense electrode 172 of the IGBT 102 are connected to the gate terminal 62 and the emitter sense terminal 72 by bonding wires, respectively.

A floating terminal 51 is provided between the emitter terminal 32E and the emitter terminal 31E. A floating terminal 52 is provided between the emitter terminal 31E and the gate terminal 62. The floating terminals 51 and 52 are not connected to any of the collector-side conductors 201 and 202 and the emitter-side conductors 301 and 302 (not illustrated), are not connected to a ground portion, and are in an electrically floating state.

The collector terminal 21C, the emitter terminal 32E, the emitter terminal 31E, the gate terminals 61 and 62, and the emitter sense terminals 71 and 72 are partially sealed with the sealing member 501, and the remaining portions including the tip end portions are exposed from one side surface 501c.

Protruding parts 511 of the sealing member 501 are provided between the collector terminal 21C and the emitter terminal 32E, between the emitter terminal 32E and the emitter terminal 31E, and between the emitter terminal 31E and the gate terminal 62. The outer peripheries of the floating terminals 51 and 52 are covered with the protruding parts 511. However, the tip end surfaces 54 of the floating terminals 51 and 52 are exposed from the protruding parts 511.

Other structures in the second embodiment are the same as those in the first embodiment.

Even in the semiconductor device 900 of the second embodiment, the floating terminals 51 and 52 are provided between the emitter terminal 31E as an AC terminal and the emitter terminal 32E as a DC terminal, and between the emitter terminal 31E as an AC terminal and the gate terminal 62, respectively.

Therefore, the same effect as the first embodiment is exhibited even in the second embodiment.

In addition, since the second embodiment is a 2-in-1 semiconductor device in which the upper and lower arm circuits are integrated, the semiconductor device can be downsized.

Third Embodiment

Figure 17:
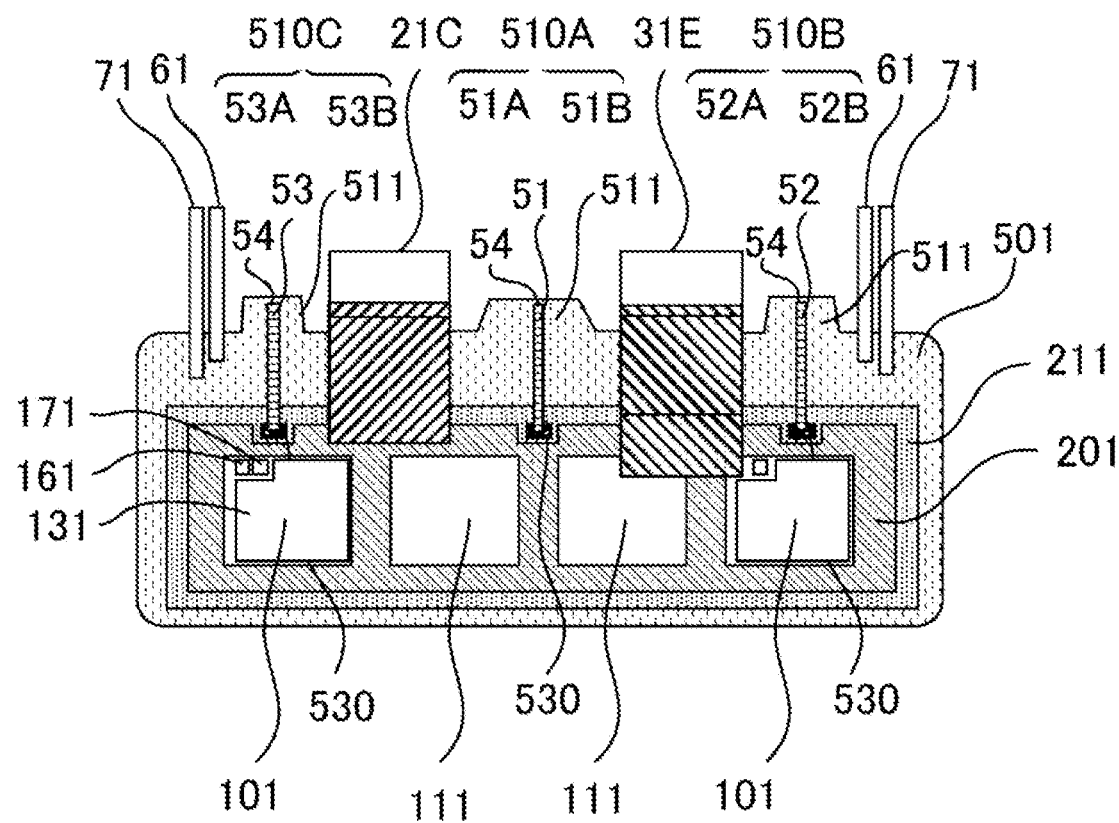
FIG. 17 shows a third embodiment of the semiconductor device of the present invention and is a plan view of the semiconductor device by seeing through an emitter-side mounting part from the upper surface side.

FIG. 17 shows a third embodiment of the semiconductor device of the present invention and is a plan view of the semiconductor device by seeing through an emitter-side mounting part from the upper surface side.

A semiconductor device 900 of the third embodiment is different from the first embodiment in that each tip end surface 54 of floating terminals 51, 52, and 53 is covered with a protruding part 511 of a sealing member 501. In addition, the semiconductor device 900 of the third embodiment is different from the first embodiment in that floating electrodes 530 connected to root-side end portions of the respective floating terminals 51, 52, and 53 are provided.

Other structures are the same as those in the first embodiment.

In the semiconductor device 900 of the third embodiment, each tip end surface 54 of the floating terminals 51, 52, and 53 is covered with the protruding part 511 of the sealing member 501 and is not exposed to the outside. Therefore, the creepage distances among the gate terminals 61, the emitter sense terminals 71, the collector terminal 21C, and the emitter terminal 31E can be increased. Accordingly, the reliability of insulation can be secured.

In addition, in the semiconductor device 900 of the third embodiment, the floating electrodes 530 connected to the root-side end portions of the respective floating terminals 51, 52, and 53 are provided. Each floating electrode 530 is fixed to the insulating layer 211, is insulated from the collector-side conductor 201 and the emitter-side conductor 301 (see FIG. 4), and is also insulated from a ground portion, so called, in an electrically floating state.

In order to manufacture the semiconductor device, a manufacturing method in which the floating terminals 51, 52, and 53 are formed as members separate from the lead frame 700 and the root-side end portions of the floating terminals 51, 52, and 53 are sealed with the sealing member 501 in a state of being joined to the floating electrodes 530 can be adopted.

In the above description, a structure in which the floating electrodes 530 are provided in the insulating layer 211 of the collector-side mounting part 220 is exemplified. However, the floating electrodes 530 may be provided in the insulating layer 311 of the emitter-side mounting part 320.

The height (length in the vertical direction) of each of the floating terminals 51, 52, and 53 is preferably higher than that of each of other terminals such as the emitter terminal 31E, the collector terminal 21C, and the gate terminals 61. This is because, if the height of each of the floating terminals 51, 52, and 53 is lower than that of each of the other terminals, regions in the other terminals that do not face the floating terminals 51, 52, and 53 exist, and portions where the voltage is not shared are generated. In the third embodiment, since the floating terminals 51, 52, and 53 are formed as members separate from the terminals and can be sealed as described above, the height of each of the floating terminals 51, 52, and 53 can be made higher than that of each of the other terminals.

Even in the semiconductor device 900 of the third embodiment, the floating terminal 51 is provided between the emitter terminal 31E as an AC terminal and the collector terminal 21C as a DC terminal. In addition, the floating terminals 52 and 53 are provided between the emitter terminal 31E and the gate terminal 61 and between the collector terminal 21C and the gate terminal 61, respectively.

Therefore, the same effect as the first embodiment is exhibited even in the third embodiment.

Fourth Embodiment

Figure 18:
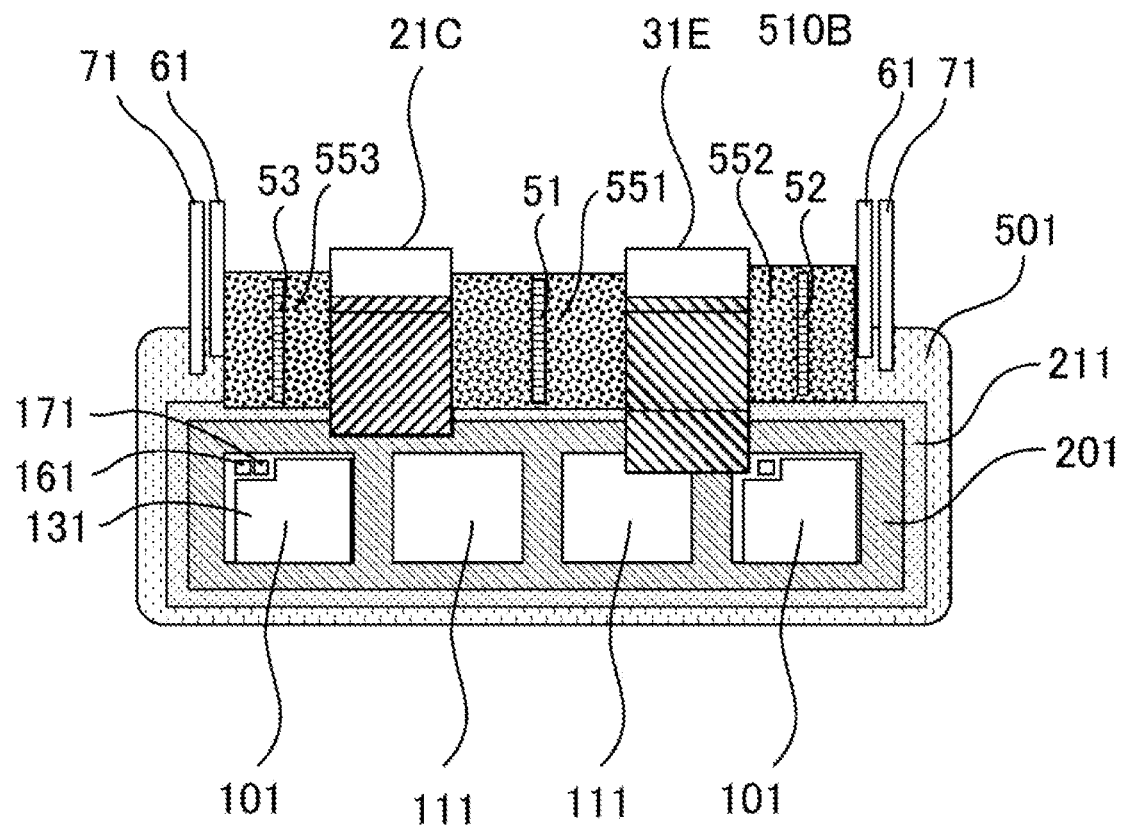
FIG. 18 shows a fourth embodiment of the semiconductor device of the present invention and is a plan view of the semiconductor device by seeing through an emitter-side mounting part from the upper surface side.

FIG. 18 shows a fourth embodiment of the semiconductor device of the present invention and is a plan view of the semiconductor device by seeing through an emitter-side mounting part from the upper surface side.

A semiconductor device 900 of the fourth embodiment is different from the first embodiment in that sealing members 551, 552, and 553 covering floating terminals 51, 52, and 53, respectively, are formed of a material different from a sealing member 501.

In this structure, a manufacturing method in which the floating terminals 51, 52, and 53 are covered with the sealing members 551, 552, and 553 in advance, respectively, and the sealing members 551, 552, and 553 with which the floating terminals 51, 52, and 53 are integrated, respectively, are integrated with the sealing member 501 when being sealed with the sealing member 501 can be adopted.

Therefore, in a state where the floating terminals 51, 52, and 53 are covered with the sealing members 551, 552, and 553, respectively, the presence or absence of a defective part such as a void or the size of the defective part in the sealing members 551, 552, and 553 can be inspected before being integrated with the sealing member 501. Accordingly, since defective products can be removed before being integrated with the sealing member 501, the yield can be improved.

As shown in FIG. 8, the corona discharge start voltage increases as the dielectric constant ε of the insulating layer decreases. For this reason, the dielectric constant of each of the sealing members 551, 552, and 553 for sealing the floating terminals 51, 52, and 53, respectively, is preferably made smaller than that of the sealing member 501. That is, in the fourth embodiment, the dielectric constant of each of the sealing members 551, 552, and 553 for sealing the floating terminals 51, 52, and 53, respectively, can be made smaller than that of the sealing member 501. The dielectric constants of the sealing members 551, 552, and 553 may be the same or different.

Other configurations of the fourth embodiment are the same as those of the first embodiment. Therefore, the same effect as the first embodiment is exhibited even in the fourth embodiment.

In addition, in the fourth embodiment, there is also an effect that the corona discharge start voltage can be increased by making the dielectric constant of each of the sealing members 551, 552, and 553 for sealing the floating terminals 51, 52, and 53, respectively, smaller than that of the sealing member 501.

It should be noted that, in the fourth embodiment, the sealing members 551, 552, and 553 sealing the floating terminals 51, 52, and 53, respectively, can be integrated with the sealing member 501 in a state of being fixed to the lead frame 700 by caulking or the like.

In addition, as with the third embodiment, the fourth embodiment can be structured in such a manner that the floating electrodes 530 are provided in the insulating layer 211 or the insulating layer 311, the root-side end portions of the floating terminals 51, 52, and 53 are exposed from the sealing members 551, 552, and 553, respectively, and the exposed portions are joined to the floating electrodes 530. With such a structure, the positional accuracy of each terminal can be improved.

In the fourth embodiment, as a method of forming the floating terminals 51, 52, and 53 in the sealing members 551, 552, and 553, respectively, an insert molding method using the floating terminals 51, 52, and 53 as insert members can be employed. In addition, a method in which the floating terminals 51, 52, and 53 are formed on surfaces of the sealing members 551, 552, and 553 whose thicknesses are half the final product by plating and then the floating terminals 51, 52, and 53 are covered and sealed with the remaining portions of the sealing members 551, 552, and 553 may be employed. Alternatively, a method in which a metal foil is fixed to a prepreg and the prepreg to which the metal foil is fixed is laminated may be employed.

Fifth Embodiment

Figure 19:
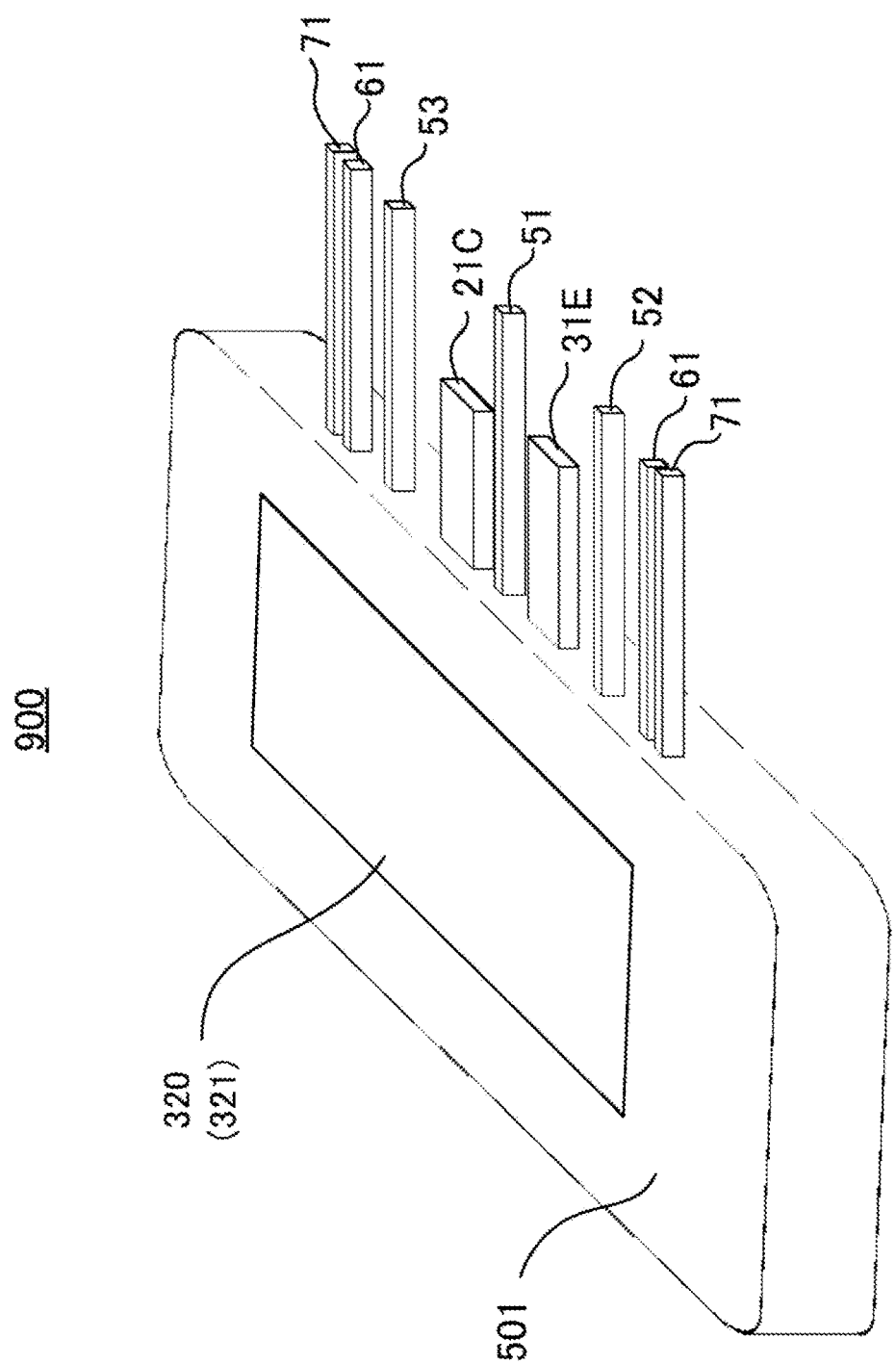
FIG. 19 is an external perspective view for showing a fifth embodiment of the semiconductor device of the present invention.

FIG. 19 is an external perspective view for showing a fifth embodiment of the semiconductor device of the present invention.

A semiconductor device 900 of the fifth embodiment is different from the first embodiment in that the lengths of floating terminals 51, 52, and 53 protruding from a sealing member 501 are made equal to or larger than the lengths of a collector terminal 21C and an emitter terminal 31E protruding from the sealing member 501.

That is, in the semiconductor device 900 of the fifth embodiment, tip end surfaces of the floating terminals 51, 52, 53 protrude as compared to tip end surfaces of the collector terminal 21C and the emitter terminal 31E.

In addition, the collector terminal 21C and the emitter terminal 31E are linearly formed, and have no bent portions bent upward or downward as in the first embodiment.

If it is not necessary to increase the creepage distances and the spatial distances among the floating terminals 51, 52, and 53 and the collector terminal 21C and the emitter terminal 31E, the assembly efficiency can be improved by adopting such a structure.

Other configurations of the fifth embodiment are the same as those of the first embodiment. Therefore, the same effect as the first embodiment is exhibited even in the fifth embodiment.

Sixth Embodiment

Figure 20:
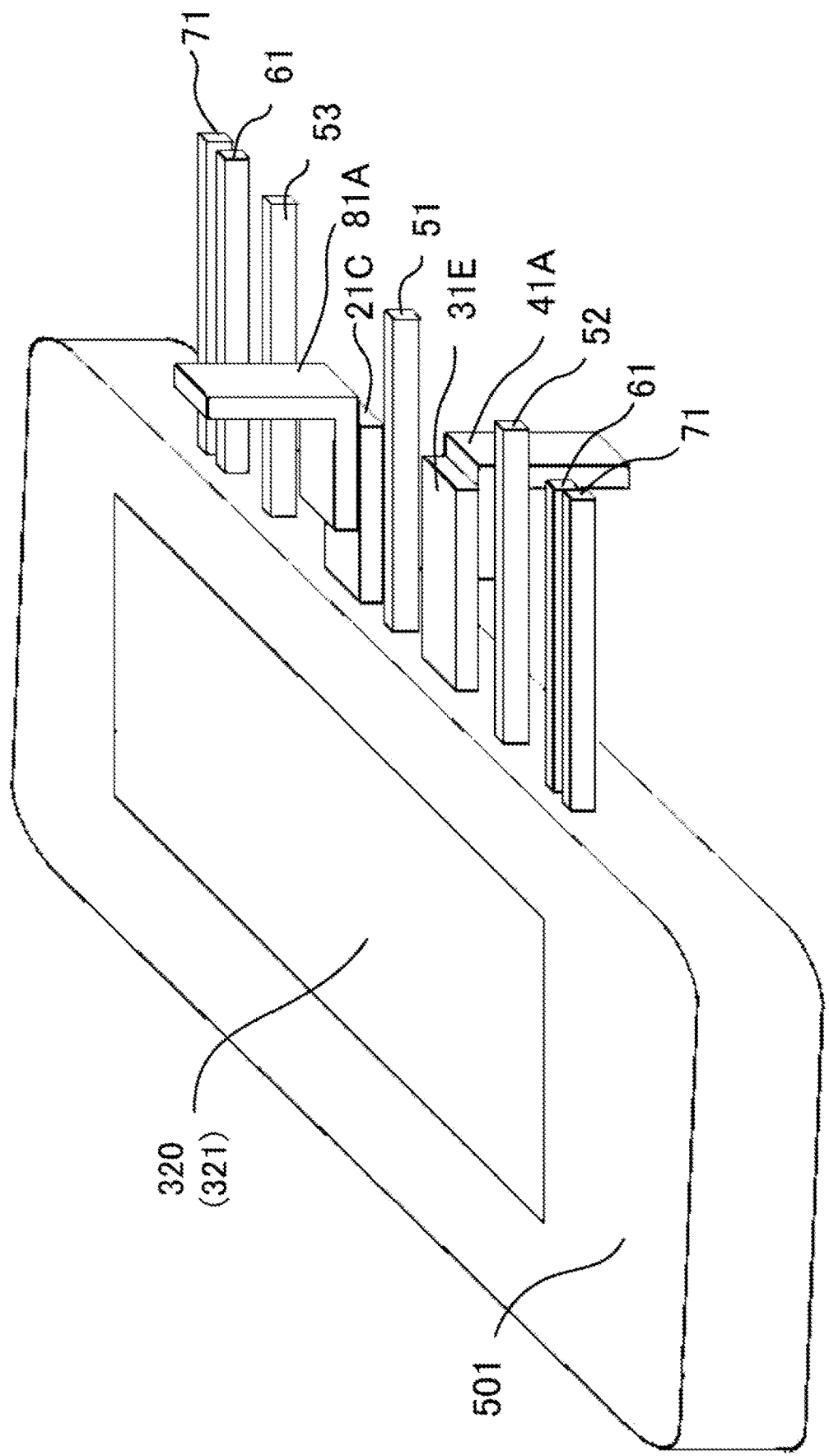
FIG. 20 is an external perspective view for showing a sixth embodiment of the semiconductor device of the present invention.

FIG. 20 is an external perspective view for showing a sixth embodiment of the semiconductor device of the present invention.

A semiconductor device 900 of the sixth embodiment has a structure in which the collector terminal 21C and the emitter terminal 31E in the first embodiment are formed as flat plate members having no bent portions, and connecting materials 81A and 41A bent in an L-shape are joined on the collector terminal 21C and the emitter terminal 31E, respectively.

Other configurations of the sixth embodiment are the same as those of the first embodiment. Therefore, the same effect as the first embodiment is exhibited even in the fifth sixth embodiment.

It should be noted that the sixth embodiment can be formed after completion of the semiconductor device 900 shown in the fifth embodiment.

Seventh Embodiment

Figure 21:
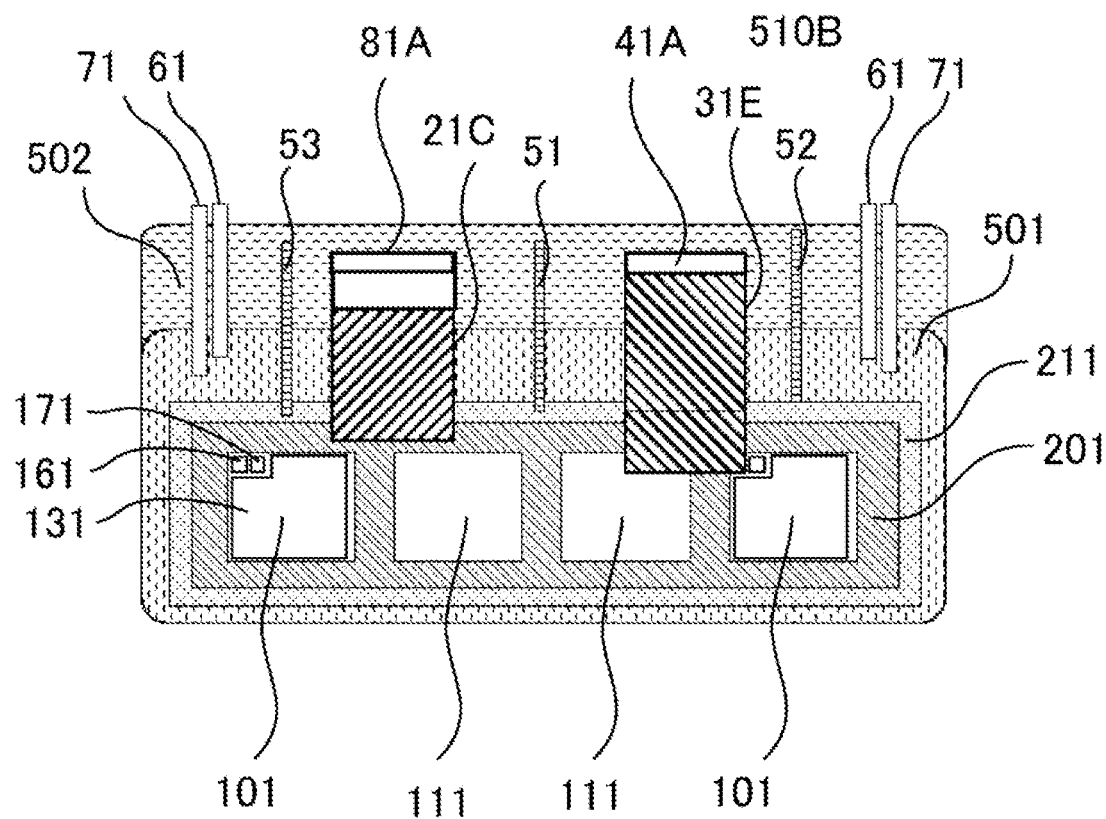
FIG. 21 shows a seventh embodiment of the semiconductor device of the present invention and 18 a plan view of the semiconductor device by seeing through an emitter-side mounting part from the upper surface side.

FIG. 21 shows a seventh embodiment of the semiconductor device of the present invention and 18 a plan view of the semiconductor device by seeing through an emitter-side mounting part from the upper surface side.

A semiconductor device 900 of the seventh embodiment has a structure in which a collector terminal 21C, an emitter terminal 31E, and floating terminals 51, 52, and 53 are all sealed with a sealing member 502 as compared to the sixth embodiment. The sealing member 502 exposes tip end sides of two gate terminals 61 and two emitter sense terminals 71, and seals the other portions.

Other configurations of the seventh embodiment are the same as those of the sixth embodiment.

It should be noted that the seventh embodiment can be formed after completion of the semiconductor device 900 of the sixth embodiment.

Even in the seventh embodiment, the floating terminal 51 is provided between the connecting material 81A connected to the collector terminal 21C as a DC terminal and the connecting material 41A connected to the emitter terminal 31E as an AC terminal. In addition, the floating terminals 52 and 53 are provided between the connecting material 41A and one gate terminal 61 and between the connecting material 81A and the other gate terminal 61, respectively.

Therefore, the same effect as the first embodiment is exhibited even in the seventh embodiment.

In the seventh embodiment, the dielectric constant of the sealing member 502 can be made smaller than that of the sealing member 501. In this way, the corona discharge start voltage can be increased as described with respect to the fourth embodiment. Therefore, even in the seventh embodiment, the thickness of the sealing member 502 can be made smaller, and the interval between the terminals can be reduced. In addition, it is accordingly possible to downsize the semiconductor device 900 and to reduce the loss due to the reduction of the inductance.

In addition, since the corona discharge start voltage is increased, the allowable tolerance of each positional deviation error of the collector terminal 21C and the emitter terminal 31E connected to the collector electrodes 121 and 122 and the emitter electrodes 131 and 132 of the IGBTs 101 and 102, respectively, can be increased, and the assembly efficiency can be improved.

In addition, in the seventh embodiment, the connecting material 81A joined to the collector terminal 21C extends upward, and the connecting material 41A joined to the emitter terminal 31E extends downward. Therefore, the creepage distance between the terminals can be increased as with the first embodiment.

It should be noted that, although the third to seventh embodiments are exemplified as the semiconductor device 900 having the upper arm circuit 901, any of the third to seventh embodiments can be the semiconductor device 900A having the lower arm circuit 902.

In addition, the third to seventh embodiments can be the semiconductor device 900 of a 2-in-1 circuit having the upper arm circuit 901 and the lower arm circuit 902 shown as the second embodiment.

Although various embodiments and modified examples have been described above, the present invention is not limited to these contents. The above-described embodiments and modified examples can be applied by being combined or appropriately modified. Other aspects that can be contemplated within the technical idea of the present invention are also included in the scope of the present invention.

The contents of the disclosure of the following application that forms the basis for priority are incorporated herein by reference.

Japanese Patent Application No. 2019-76467 (filed on Apr. 12, 2019)

DESCRIPTION OF REFERENCE CHARACTERS

21C: Collector terminal (DC terminal)
22C: Collector terminal (AC terminal)
31E: Emitter terminal (AC terminal)
32E: Emitter terminal (DC terminal)
41A: Connecting material (AC terminal member)
51, 52, 53: Floating terminal
54: Tip end surface
61, 62: Gate terminal (control terminal)
81A: Connecting material (DC terminal member)
101, 102: IGBT (semiconductor element)
111, 112: Diode
161, 162: Gate electrode (control electrode)
162: Gate electrode
170: Control unit
201, 202: Collector-side conductor
211: Insulating layer
220: Collector-side mounting part
311: Insulating layer
320: Emitter-side mounting part
501, 502: Sealing member
511: Protruding part
530: Floating electrode
551, 552, 553: Sealing member
700: Lead frame
801: Capacitor module
802: Battery
900, 900A: Semiconductor device
901: Upper arm circuit
902: Lower arm circuit

The invention claimed is:

1. A semiconductor device comprising:
a semiconductor element that converts direct-current electric power into alternating-current electric power;
a direct-current terminal that transmits direct-current electric power;
an alternating-current terminal that transmits alternating-current electric power;
a sealing member that seals the semiconductor element, at least a part of the direct-current terminal, and at least a part of the alternating-current terminal;
at least one floating terminal that is arranged between the direct-current terminal and the alternating-current terminal;
an insulating layer that supports the semiconductor element; and
a floating electrode that is formed on the insulating layer, wherein a root portion of the floating terminal is connected to the floating electrode.

2. The semiconductor device according to claim 1, wherein the floating terminal is covered with a resin made of a material different from that of the sealing member.

3. The semiconductor device according to claim 1, wherein the entire floating terminal including a tip end portion is covered with the sealing member and/or a resin made of a material different from the sealing member.

4. The semiconductor device according to claim 1, wherein at least a part of the floating terminal is covered with a resin having a dielectric constant smaller than that of the sealing member.

5. The semiconductor device according to claim 1, wherein a tip end surface of the floating terminal protrudes as compared to a tip end surface of the direct-current terminal and a tip end surface of the alternating-current terminal.

6. The semiconductor device according to claim 1, wherein a root portion of the direct-current terminal, a root portion of the alternating-current terminal, and the root portion of the floating terminal are substantially linearly arrayed, and a tip end portion of the direct-current terminal or a direct-current terminal member connected to the direct-current terminal and a tip end portion of the alternating-current terminal or an alternating-current terminal member connected to the alternating-current terminal extend in directions opposite to each other in a height direction of the floating terminal.

7. An electric power conversion device comprising:
a semiconductor device comprising
   a semiconductor element that converts direct-current electric power into alternating-current electric power;
   a direct-current terminal that transmits direct-current electric power;
   an alternating-current terminal that transmits alternating-current electric power;
   a sealing member that seals the semiconductor element, at least a part of the direct-current terminal, and at least a part of the alternating-current terminal; and
   at least one floating terminal that is arranged between the direct-current terminal and the alternating-current terminal; and
   a control terminal that is connected to a control electrode of the semiconductor element,
   wherein the control terminal is provided adjacent to the direct-current terminal or the alternating-current terminal, and
   wherein at least another floating terminal is provided between the control terminal and the direct-current terminal or the alternating-current terminal.

8. A manufacturing method of a semiconductor device, comprising:
   connecting each of a direct-current terminal and an alternating-current terminal to a semiconductor element that converts direct-current electric power into alternating-current electric power;
   supporting the semiconductor element on an insulating layer;
   sealing the semiconductor element and at least a part of each of the direct-current terminal and the alternating-current terminal with a sealing member; and
   providing at least one floating terminal between the direct-current terminal and the alternating-current terminal, and connecting a root portion of the at least one floating terminal to a floating electrode formed on the insulating layer.

9. The manufacturing method of the semiconductor device according to claim 8, wherein providing the floating terminal includes
   forming a lead frame in which the floating terminal is integrated with the direct-current terminal and the alternating-current terminal,
   sealing a part of each of the direct-current terminal, the alternating-current terminal, and the floating terminal of the lead frame with the sealing member, and
   separating the direct-current terminal, the alternating-current terminal, and the floating terminal from each other by cutting the lead frame.

* * * * *